US011152193B2

United States Patent
Toyoda et al.

(10) Patent No.: US 11,152,193 B2
(45) Date of Patent: Oct. 19, 2021

(54) PLASMA GENERATION APPARATUS

(71) Applicant: NATIONAL UNIVERSITY CORPORATION TOKAI NATIONAL HIGHER EDUCATION AND RESEARCH SYSTEM, Nagoya (JP)

(72) Inventors: Hirotaka Toyoda, Nagoya (JP); Haruka Suzuki, Nagoya (JP)

(73) Assignee: NATIONAL UNIVERSITY CORPORATION TOKAI NATIONAL HIGHER EDUCATION AND RESEARCH SYSTEM, Nagoya (JP)

( * ) Notice: Subject to any disclaimer, the term of this patent is extended or adjusted under 35 U.S.C. 154(b) by 0 days.

(21) Appl. No.: 16/954,582

(22) PCT Filed: Dec. 17, 2018

(86) PCT No.: PCT/JP2018/046370
§ 371 (c)(1),
(2) Date: Jun. 17, 2020

(87) PCT Pub. No.: WO2019/124315
PCT Pub. Date: Jun. 27, 2019

(65) Prior Publication Data
US 2020/0335308 A1    Oct. 22, 2020

(30) Foreign Application Priority Data
Dec. 18, 2017   (JP) .............................. JP2017-242257

(51) Int. Cl.
*H01J 37/32* (2006.01)
*H01P 3/12* (2006.01)

(52) U.S. Cl.
CPC .......... *H01J 37/32229* (2013.01); *H01P 3/12* (2013.01)

(58) Field of Classification Search
CPC ............................. H01J 37/32229; H01P 3/12
See application file for complete search history.

(56) References Cited

U.S. PATENT DOCUMENTS 5,955,382 A * 9/1999 Yamauchi ......... H01J 37/32229
                                                        438/726
6,204,606 B1 * 3/2001 Spence ............. H01J 37/32192
                                                        118/723 ME
(Continued)

FOREIGN PATENT DOCUMENTS

JP        2014-175051 A    9/2014

OTHER PUBLICATIONS

Feb. 26, 2019 International Search Report issued in International Patent Application No. PCT/JP2018/046370.

*Primary Examiner* — Kurtis R Bahr
(74) *Attorney, Agent, or Firm* — Oliff PLC

(57) ABSTRACT

A waveguide has a first conductor surface facing toward the interior of the waveguide, a second conductor surface facing toward the interior of the waveguide, and a slot extending from the first conductor surface to the outside of the waveguide. The first conductor surface and the second conductor surface electrically communicate with each other and face each other. The first length in the y direction of the first conductor surface in a cross section perpendicular to the z direction is smaller than the second length in the y direction of the second conductor surface in the cross section perpendicular to the z direction. The first length includes the length in the y direction of the slot in the cross section perpendicular to the z direction. The second length is smaller than (Continued)

the distance between the first conductor surface and the second conductor surface in the x direction.

9 Claims, 13 Drawing Sheets

(56) References Cited

U.S. PATENT DOCUMENTS

| | | | |
|---|---|---|---|
| 8,136,479 B2* | 3/2012 | Sugai | H01J 37/32192 118/723 MW |
| 9,252,000 B2 | 2/2016 | Itoh et al. | |
| 2014/0251955 A1* | 9/2014 | Itoh | H01J 37/32211 216/69 |
| 2017/0365446 A1* | 12/2017 | Itoh | H01J 37/32311 |

* cited by examiner

PLASMA GENERATION APPARATUS

TECHNICAL FIELD

The technical field of the present specification relates to a plasma generation apparatus which generates plasma by using a microwave.

BACKGROUND ART

Plasma technology has been applied to the fields of electricity, chemistry, and materials. Plasma generates radicals which are high in chemical reactivity and ultraviolet rays, as well as electrons and positive ions. Radicals are used for, for example, film formation and etching of semiconductors. Ultraviolet rays are used for, for example, sterilization. Such plentiful matters originating from plasma have expanded the range of fields in which plasma technology is put into practice.

A device in which microwaves are used for generation of plasma exists. For example, Patent Document 1 discloses a plasma generation apparatus in which a microwave is transmitted from a microwave generation unit to a waveguide, and plasma is generated from a slot (slit-like through hole) provided in the waveguide (see FIGS. 1, 4, etc. of Patent Document 1).

PRIOR ART DOCUMENT

Patent Document

Patent Document 1: Japanese Patent Application Laid-Open (kokai) No. 2014-175051

SUMMARY OF THE INVENTION

Problem to be Solved by the Invention

In the technique of Patent Document 1, plasma is jetted from the slot. However, an electric field generated at the slot is not necessarily large. A larger electric field must be generated at the slot in order to generate stable plasma.

The technique of the present specification has been accomplished so as to solve the problem of the above-described conventional technique. Namely, its object is to provide a plasma generation apparatus which generates plasma from a slot of a waveguide by transmitting a microwave into the waveguide and in which a stronger electric field is generated at the slot.

Means for Solving the Problem

A plasma generation apparatus according to a first aspect includes a waveguide extending in a z direction in an xyz rectangular coordinate system, and a microwave generation unit for generating a microwave which propagates through the waveguide in the z direction. The waveguide has a first conductor surface facing toward the interior of the waveguide, a second conductor surface facing toward the interior of the waveguide, and a slot extending from the first conductor surface to the outside of the waveguide. The first conductor surface and the second conductor surface electrically communicate with each other and face each other. A first length which is the length in a y direction of the first conductor surface in a cross section perpendicular to the z direction is smaller than a second length which is the length in the y direction of the second conductor surface in the cross section perpendicular to the z direction. The first length includes the length in the y direction of the slot in the cross section perpendicular to the z direction. The second length is smaller than the distance between the first conductor surface and the second conductor surface in an x direction.

In this plasma generation apparatus, the first length is smaller than the second length. Therefore, when the microwave propagates through the waveguide, a strong electric field is formed at the location of the slot (slit-shaped through hole). Also, since a gas is jetted from the slot, plasma is generated on the outside of the slot. The plasma is generated in an elongated region along the slot.

Effect of the Invention

In the present specification, there is provided a plasma generation apparatus which generates plasma from a slot of a waveguide by transmitting a microwave into the waveguide and in which a stronger electric field is generated at the slot.

MODES FOR CARRYING OUT THE INVENTION

Specific embodiments will now be described with reference to the drawings, with a plasma generation apparatus for generating plasma by using a microwave being used as an example. An xyz rectangular coordinate system is used for convenience of description. Therefore, the extension direction of a waveguide will be referred to as the z direction (see FIGS. 14 and 16, which will be described later).

First Embodiment

1. Plasma Generation Apparatus

Figure 1:
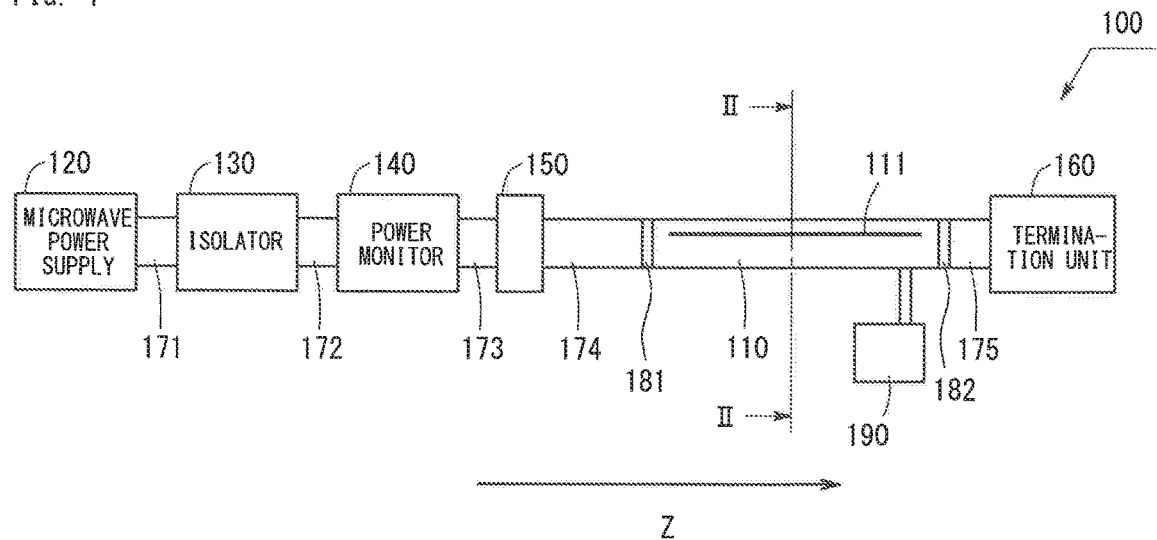
FIG. 1 Schematic diagram of a plasma generation apparatus of a first embodiment.

FIG. 1 is a schematic diagram of a plasma generation apparatus 100 of a first embodiment. The plasma generation apparatus 100 generates plasma by using a waveguide through which a microwave propagates. The plasma generation apparatus 100 includes a waveguide 110, a microwave generation unit 120, an isolator 130, a power monitor 140, an EH tuner 150, a termination unit 160, connection waveguides 171, 172, 173, and 174, pressure window waveguides 181 and 182, and a gas supply unit 190.

Each of the waveguide 110, the connection waveguides 171, 172, 173, and 174, and the pressure window waveguides 181 and 182 is a rectangular waveguide. The waveguide 110, the connection waveguides 171, 172, 173, and 174, and the pressure window waveguides 181 and 182 share a common center axis.

The waveguide 110 extends in the z direction. The waveguide 110 has a slot 111. The slot 111 is a slit-like through hole provided in the waveguide 110. Plasma is generated at the slot 111 as will be described in detail later. The longer sides of a cross section of the waveguide 110 perpendicular to the center axis have a length of, for example, 96 mm. The shorter sides of the cross section of the waveguide 110 perpendicular to the center axis have a length of, for example, 27 mm. Preferably, the material of the waveguide 110 is a metal (e.g., copper, aluminum, iron, or stainless steel) or an alloy of these metallic materials.

The microwave generation unit 120 generates a microwave which propagates through the waveguide 110. The microwave propagates through the waveguide 110 in the z direction. The microwave is, for example, a sinusoidal wave or a rectangular wave. Preferably, the microwave is transmitted in the $TE_{10}$ mode. The microwave generation unit 120 is, for example, a magnetron, a klystron, a gyrotron, or a traveling wave tube. The frequency of the microwave generated by the microwave generation unit 120 is, for example, 2.45 GHz. Needless to say, the frequency may be other than 2.45 GHz. These are mere examples, and the configuration of the microwave generation unit 120 may differ from the above-described configuration.

The isolator 130 prevents reflection waves of the microwave from entering the microwave generation unit 120. The isolator 130 transmits the microwave transmitted from the microwave generation unit 120 toward the waveguide 110 and releases the microwave propagating from the waveguide 110 toward the microwave generation unit 120. As a result, it is possible to prevent the reflection waves of the microwave from the waveguide 110, etc., from entering the microwave generation unit 120.

The power monitor 140 measures the power of the microwave transmitted to the waveguide 110. The power monitor 140 can also measure the reflection waves from the waveguide 110.

The EH tuner 150 includes an E tuner section and an H tuner section. The EH tuner 150 performs impedance adjustment by moving respective plungers into and out from the E tuner section and the H tuner section.

The termination unit 160 is a member for absorbing the microwave. The microwave propagating through the waveguide 110 generates plasma over the region of the slot 111. Therefore, the intensity of the microwave reaching the termination unit 160 is sufficiently low. In some case, the termination unit 160 may reflect a portion of the microwave.

Each of the connection waveguides 171, 172, 173, and 174 is an ordinary rectangular waveguide. Preferably, the material of the connection waveguides 171, 172, 173, and 174 is a metal (e.g., copper, aluminum, iron, or stainless steel) or an alloy of these metallic materials.

The pressure window waveguides 181 and 182 are partitions located at opposite ends of the waveguide 110. Therefore, the pressure window waveguides 181 and 182 are disposed on opposite sides of the waveguide 110.

The gas supply unit 190 supplies a gas to the waveguide 110. The gas supplied from the gas supply unit 190 is converted to plasma when jetted from the slot 111. The gas supplied from the gas supply unit 190 is, for example, a noble gas such as Ar or Ne. Alternatively, the gas may be nitrogen gas or oxygen gas. Needless to say, the gas may be ordinary air. Alternatively, the gas may be a mixture of these gases.

2. Structure of the Waveguide

Figure 2:
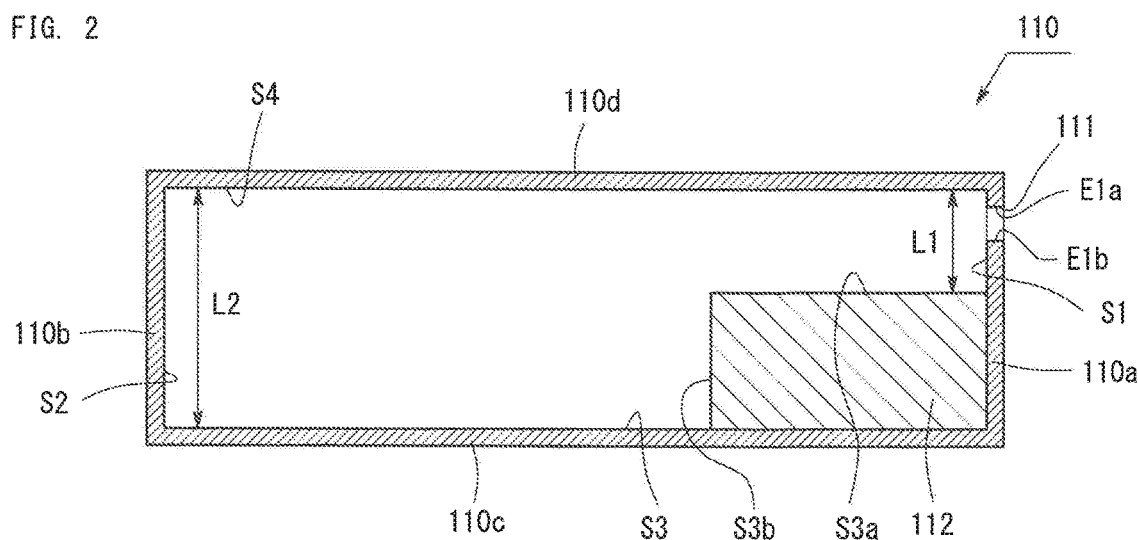
FIG. 2 Sectional view showing a cross section of a waveguide of the plasma generation apparatus of the first embodiment.

FIG. 2 is a sectional view showing a cross section of the waveguide 110 of the plasma generation apparatus 100 of the first embodiment. FIG. 2 shows a cross section of the waveguide 110 taken along line II-II of FIG. 1. As shown in FIG. 2, the waveguide 110 has a first wall portion 110a, a second wall portion 110b, a third wall portion 110c, and a fourth wall portion 110d. The first wall portion 110a and the second wall portion 110b face each other and extend in the transmission direction of the waveguide 110. The third wall portion 110c and the fourth wall portion 110d face each other and extend in the transmission direction of the waveguide 110. The first wall portion 110a and the second wall portion 110b correspond to the shorter sides of a cross section of the waveguide 110 perpendicular to the transmission direction. The third wall portion 110c and the fourth wall portion 110d correspond to the longer sides of the cross section of the waveguide 110 perpendicular to the transmission direction. The third wall portion 110c is continuous with the first wall portion 110a and the second wall portion 110b. The fourth wall portion 110d is continuous with the first wall portion 110a and the second wall portion 110b.

2-1. Slot and Metallic Member

The first wall portion 110a of the waveguide 110 has the slot 111. The slot 111 extends from a first conductor surface S1, which will be described later, to the outside of the waveguide 110. The slot 111 is formed such that the angle of the longitudinal direction of the slot 111 in relation to the transmission direction of the waveguide 110 is not 90°. Preferably, the angle of the longitudinal direction of the slot 111 in relation to the transmission direction of the waveguide 110 falls within the range of −5° to 5°. More preferably, the longitudinal direction of the slot 111 is parallel to the transmission direction of the waveguide 110. The waveguide 110 has a first portion E1a and a second portion E1b at the location of the slot 111. The first portion E1a and the second portion E1b face each other with the slot 111 intervening therebetween.

The waveguide 110 has a metallic member 112 located adjacent to the first wall portion 110a and the third wall portion 110c. The metallic member 112 is a first metallic member having the shape of a rectangular parallelepiped. The metallic member 112 is in contact with the first wall portion 110a and the third wall portion 110c. The material of the metallic member 112 is a metal (e.g., copper, aluminum, iron, or stainless steel) or an alloy of these metallic materials. Preferably, the material of the metallic member 112 is the same as the material of the waveguide 110. Needless to say, the metallic member 112 does not close the slot 111. Therefore, the slot 111 is formed in the first wall portion 110a at a position near the fourth wall portion 110d.

2-2. Distance Between Conductor Surfaces

The first wall portion 110a has the slot 111 and a first conductor surface S1 facing toward the interior of the waveguide 110. The second wall portion 110b has a second conductor surface S2 facing toward the interior of the waveguide 110. The third wall portion 110c has a third conductor surface S3 facing toward the interior of the waveguide 110. The fourth wall portion 110d has a fourth conductor surface S4 facing toward the interior of the waveguide 110. The first conductor surface S1 is a surface exposed to the interior of the waveguide 110. This also applies to the remaining conductor surfaces. Since the metallic member 112 is present, in the cross section of the waveguide 110 perpendicular to the transmission direction, the length of the first conductor surface S1 is smaller than the length of the second conductor surface S2 by an amount corresponding to the height of the metallic member 112.

The first conductor surface S1 and the second conductor surface S2 are surfaces parallel to the yz plane. Each of the first conductor surface S1 and the second conductor surface S2 may contain a surface parallel to the yz plane. The third conductor surface S3 and the fourth conductor surface S4 are surfaces parallel to the xz plane. Each of the third conductor surface S3 and the fourth conductor surface S4 may contain a surface parallel to the xz plane. The first conductor surface S1 and the second conductor surface S2 electrically communicate with each other and face each other. The third conductor surface S3 and the fourth conductor surface S4 electrically communicate with each other and face each other.

The third conductor surface S3 is continuous with the second conductor surface S2. Since the metallic member 112 is present, the waveguide 110 has a first partial surface S3a and a second partial surface S3b. The first partial surface S3a and the second partial surface S3b are connection surfaces for connecting the first conductor surface S1 and the third conductor surface S3. The first partial surface S3a faces the fourth conductor surface S4. The second partial surface S3b faces the second conductor surface S2. The fourth conductor surface S4 is continuous with the first conductor surface S1 and the second conductor surface S2. The first partial surface S3a, the second partial surface S3b, and the third conductor surface S3 are disposed in this order from the side toward the first conductor surface S1.

FIG. 2 shows a cross section perpendicular to the z direction. The first length L1 (in the y direction) of the first conductor surface S1 in the cross section perpendicular to the z direction is smaller than the second length L2 (in the y direction) of the second conductor surface S2 in the cross section perpendicular to the z direction. The first length L1 includes the length (in the y direction) of the slot 111 in the cross section perpendicular to the z direction. The second length L2 is smaller than the distance in the x direction between the first conductor surface S1 and the second conductor surface S2.

2-3. Gas Supply Hole

The waveguide 110 has a gas supply hole (not shown) for supplying a gas into the interior of the waveguide 110. The gas supply hole is a hole for supplying the gas from the gas supply unit 190 into the waveguide 110. The gas supplied through the gas supply hole is jetted from the slot 111.

3. Plasma Generation Region

A strong electric field is formed between the first portion E1a and the second portion E1b of the waveguide 110. Also, the gas is jetted from the slot 111 toward the outside of the waveguide 110. Therefore, the gas is converted to plasma.

Figure 3:
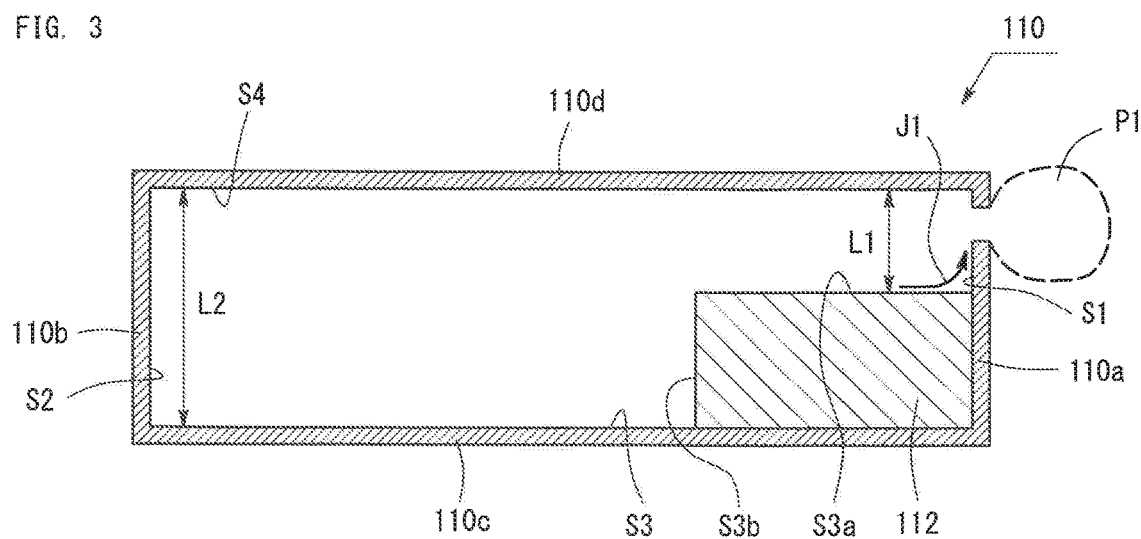
FIG. 3 View showing a plasma generation region of the waveguide of the plasma generation apparatus of the first embodiment.

FIG. 3 is a view showing a plasma generation region P1 of the waveguide 110. As shown in FIG. 3, the plasma generation region P1 is a straight region extending along the slot 111 and located on the outer side of the waveguide 110. In FIG. 3, the plasma generation region P1 is drawn conceptually. Therefore, in actuality, the plasma generation region P1 may be larger or smaller than the region shown in FIG. 3.

4. Electric Field Intensity at the Slot

In the plasma generation apparatus 100 of the present embodiment, a strong electric field is generated between the first portion E1a and the second portion E1b at the slot 111. The reason for this will be described.

As shown in FIG. 2, the first distance L1 on the side toward the first wall portion 110a where the slot 111 is present is smaller than the second distance L2 on the side toward the second wall portion 110b. The impedance on the side toward the first wall portion 110a is smaller than the impedance on the side toward the second wall portion 110b. Namely, the voltage on the side toward the first wall portion 110a is smaller than the voltage on the side toward the second wall portion 110b. The current on the side toward the first wall portion 110a is larger than the current on the side toward the second wall portion 110b. As described above, a larger surface current flows through the waveguide 110 on the side toward the first wall portion 110a.

The following equation is the Ampere-Maxwell equation.

$$\nabla \times H = j + \frac{\partial D}{\partial t} \quad (1)$$

Here, current j represents the density of surface current flowing in the direction of an arrow J1 of FIG. 3. As described above, the surface current flowing to the vicinity of the slot 111 is larger than the surface current flowing toward the second wall portion 110b.

In regions where the slot 111 is not present, the current j flows in the direction of the arrow J1 of FIG. 3. However, when the microwave tries to propagate through a region where the slot 111 is present, the current j is shut off abruptly. The first term on the right side of Equation (1) becomes zero abruptly. When the first term on the right side becomes zero abruptly, instead, the value of $\partial D/\partial t$, which is the second term on the right side, increases sharply. As a result, a strong electric field is formed between the first portion E1a and the second portion E1b of the waveguide 110. Therefore, plasma can be generated efficiently.

5. Method for Operating the Plasma Generation Apparatus

First, the gas supply unit 190 supplies a gas to the waveguide 110. As a result, the gas is jetted from the slot 111 of the waveguide 110. Next, the microwave generation unit 120 generates a microwave and transmits the microwave toward the waveguide 110. At the location of the slot 111 of the waveguide 110, a strong electric field is formed between the first portion E1a and the second portion E1b. Therefore, the gas jetted from the slot 111 is converted to plasma. Namely, plasma is generated in the plasma generation region P1.

6. Effect of the Present Embodiment

The waveguide 110 of the first embodiment has the metallic member 112 in contact with the first wall portion 110a and the third wall portion 110c. The first wall portion 110a corresponds to a shorter side of a cross section of the waveguide 110 perpendicular to the center axis. The first wall portion 110a of the waveguide 110 has the slot 111. The slot 111 is formed in the first wall portion 110a. Namely, the slot 111 is formed in the wall portion which corresponds to a shorter side of a cross section of the waveguide 110 perpendicular to the center axis and with which the metallic member 112 is in contact. When the microwave is transmitted to the waveguide 110, a very strong electric field is formed between the first portion E1a and the second portion E1b at the slot 111. Also, since the gas is jetted from the slot 111, plasma is generated on the outer side of the slot 111. The plasma is generated in a rod-shaped elongated region along the slot.

7. Modifications

7-1. Device Configuration

Figure 4:
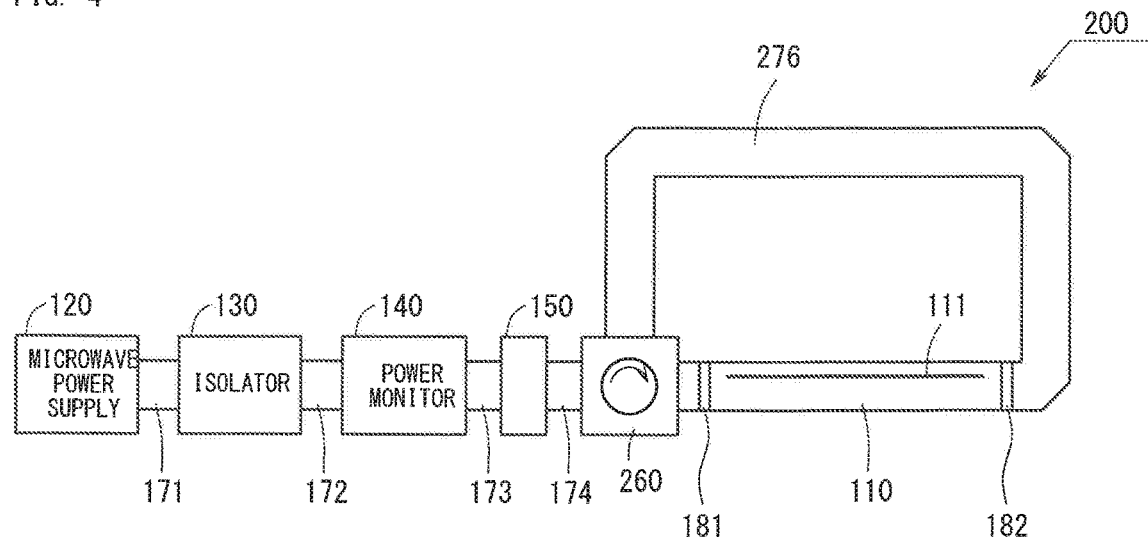
FIG. 4 Schematic diagram of a plasma generation apparatus according to a modification of the first embodiment.

A plasma generation apparatus 200 shown in FIG. 4 may be used. The plasma generation apparatus 200 includes a circulator 260 and a waveguide 276 in place of the termination unit 160.

Alternatively, in place of the termination unit 160, a reaction chamber for treating a substrate with plasma may be provided.

7-2. Dimensions of the Waveguide

The longer sides of a cross section of the waveguide 110 perpendicular to the transmission direction may have a length of, for example, 72.1 mm. The shorter sides of the cross section of the waveguide 110 perpendicular to the transmission direction may have a length of, for example, 34 mm. The dimensions of the cross sectional shape of the waveguide 110 may be those different from the above-described dimensions.

7-3. Impedance Matcher

In the present embodiment, an EH tuner 150 is used. However, instead of the EH tuner 150, any of other impedance matchers may be used.

7-4. Operation Sequence of the Plasma Generation Apparatus

In the embodiment, a gas is supplied from the gas supply unit 190 to the waveguide 110, and subsequently, a microwave is transmitted to the waveguide 110. However, the operation sequence may be reversed. Namely, the microwave may be transmitted to the waveguide 110, and subsequently, the gas may be supplied from the gas supply unit 190 to the waveguide 110.

7-5. Combinations

The above-described modifications may be combined freely.

Second Embodiment

A second embodiment will be described. Waveguides of the second embodiment include metallic members different from the metallic member used in the waveguide of the first embodiment.

1. Shape of the Metallic Member

1-1. First Shape

Figure 5:
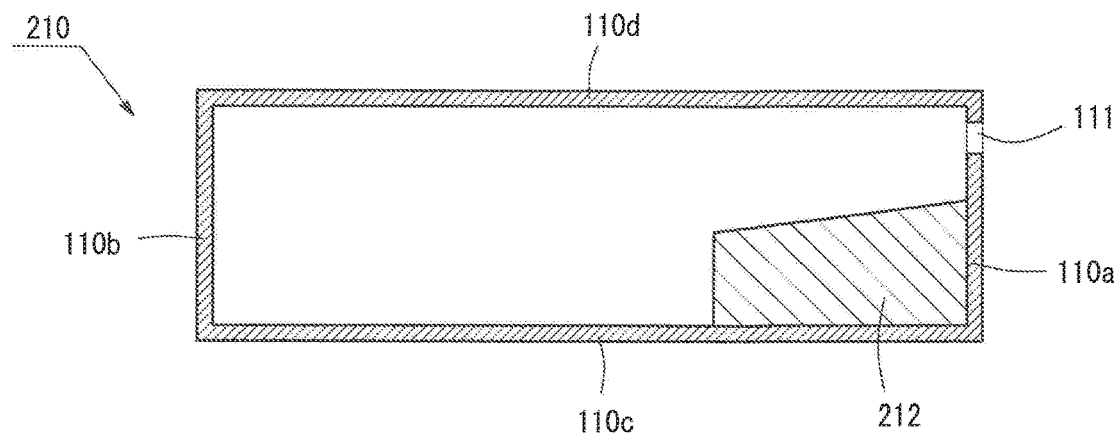
FIG. 5 Sectional view showing the cross-sectional shape of a first waveguide of a second embodiment.

FIG. 5 is a sectional view showing the cross-sectional shape of a (first) waveguide 210 of the second embodiment. As shown in FIG. 5, the waveguide 210 includes a metallic member 212. The metallic member 212 is a hexahedron. In a cross section of the waveguide 210 perpendicular to the center axis, the height of the metallic member 212 decreases with the distance from the first wall portion 110a. Namely, the distance between the fourth wall portion 110d and the metallic member 212 increases with the distance from the first wall portion 110a.

The distance between the fourth conductor surface S4 and a connection surface of the metallic member 212 increases with the distance from the first conductor surface S1. The connection surface is a surface of the metallic member 212 which connects the first conductor surface S1 and the third conductor surface S3.

1-2. Second Shape

Figure 6:
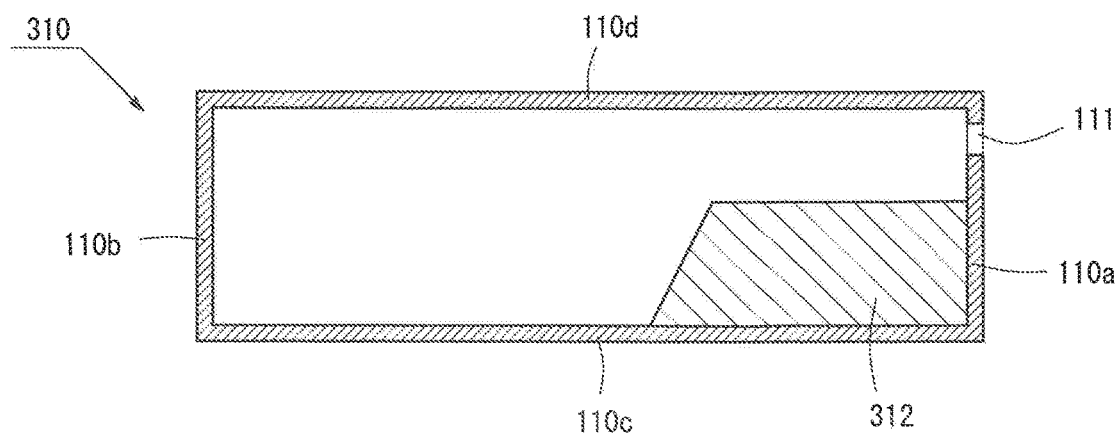
FIG. 6 Sectional view showing the cross-sectional shape of a second waveguide of the second embodiment.

FIG. 6 is a sectional view showing the cross-sectional shape of a (second) waveguide 310 of the second embodiment. As shown in FIG. 6, the waveguide 310 includes a metallic member 312. The metallic member 312 is a hexahedron. In a cross section of the waveguide 310 perpendicular to the center axis, the width of the metallic member 312 decreases with the distance from the third wall portion 110c. Namely, the distance between the second wall portion 110b and the metallic member 312 increases with the distance from the third wall portion 110c.

The distance between the fourth conductor surface S4 and a connection surface of the metallic member 312 increases with the distance from the first conductor surface S1. The connection surface is a surface of the metallic member 312 which connects the first conductor surface S1 and the third conductor surface S3.

1-3. Third Shape

Figure 7:
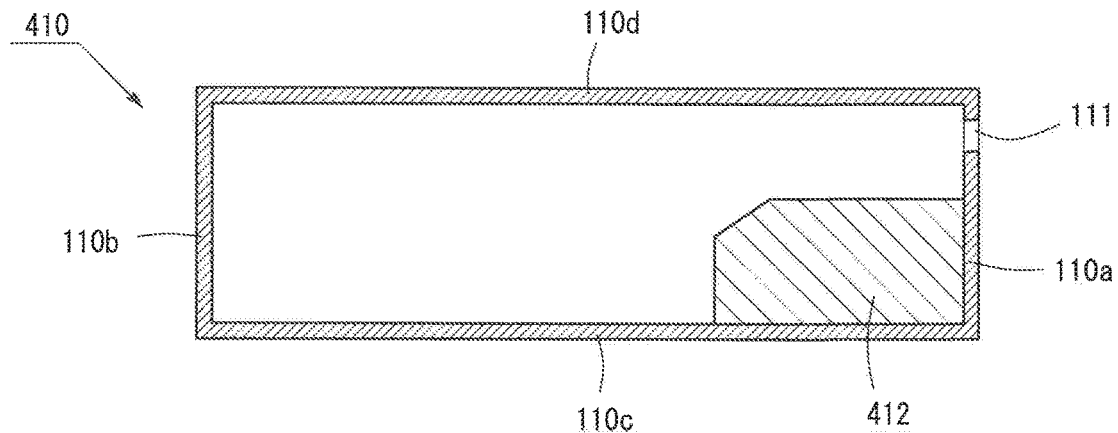
FIG. 7 Sectional view showing the cross-sectional shape of a third waveguide of the second embodiment.

FIG. 7 is a sectional view showing the cross-sectional shape of a (third) waveguide 410 of the second embodiment. As shown in FIG. 7, the waveguide 410 includes a metallic member 412. The metallic member 412 is a pentagonal prism. In the metallic member 412, a corner located diagonally opposite a corner in contact with the first wall portion 110a and the third wall portion 110c is chamfered.

The distance between the fourth conductor surface S4 and a connection surface of the metallic member 412 increases with the distance from the first conductor surface S1. The connection surface is a surface of the metallic member 412 which connects the first conductor surface S1 and the third conductor surface S3.

1-4. Fourth Shape

Figure 8:
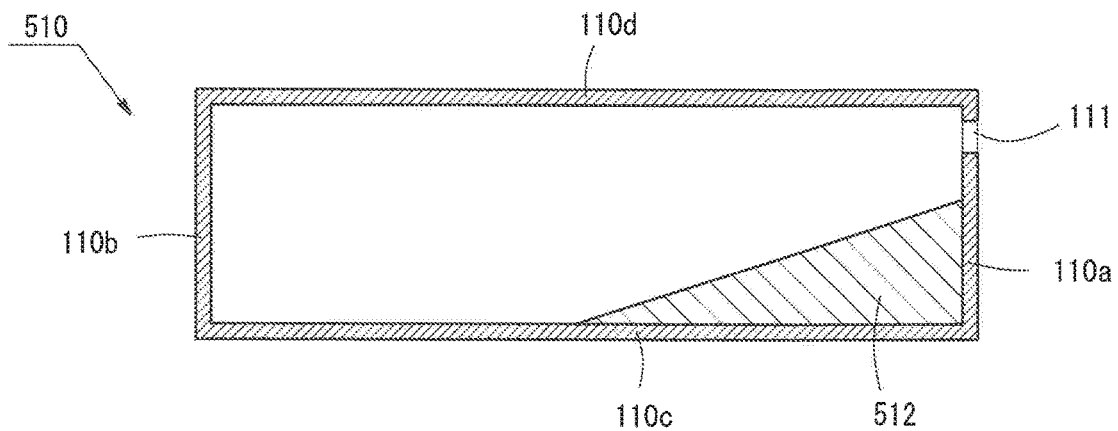
FIG. 8 Sectional view showing the cross-sectional shape of a fourth waveguide of the second embodiment.

FIG. 8 is a sectional view showing the cross-sectional shape of a (fourth) waveguide 510 of the second embodiment. As shown in FIG. 8, the waveguide 510 includes a metallic member 512. The metallic member 512 is a triangular prism. In a cross section of the waveguide 510 perpendicular to the center axis, the height of the metallic member 512 decreases with the distance from the first wall portion 110a. Namely, the distance between the fourth wall portion 110d and the metallic member 512 increases with the distance from the first wall portion 110a. In a cross section of the waveguide 510 perpendicular to the center axis, the width of the metallic member 512 decreases with the distance from the third wall portion 110c. Namely, the distance between the second wall portion 110b and the metallic member 512 increases with the distance from the third wall portion 110c.

The distance between the fourth conductor surface S4 and a connection surface of the metallic member 512 increases with the distance from the first conductor surface S1. The connection surface is a surface of the metallic member 512 which connects the first conductor surface S1 and the third conductor surface S3.

2. Arrangement of the Metallic Member 2-1. First Arrangement

Figure 9:
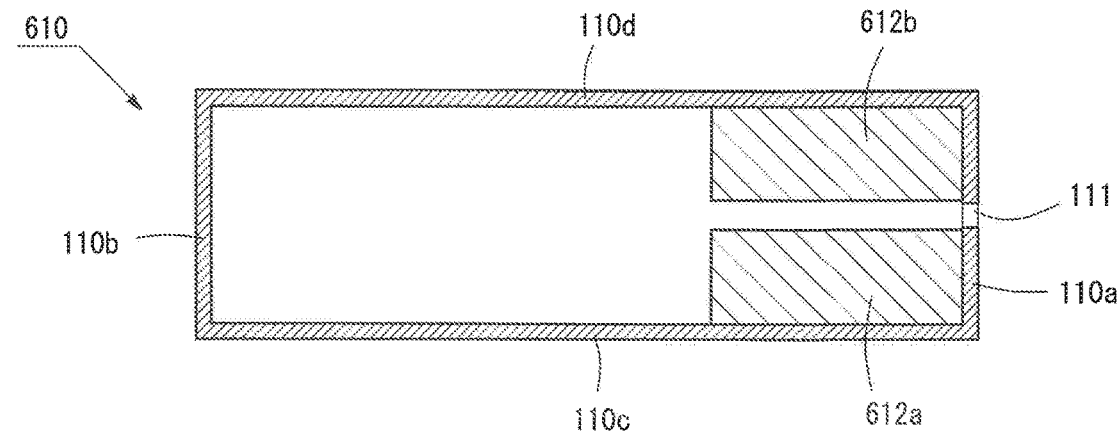
FIG. 9 Sectional view showing the cross-sectional shape of a fifth waveguide of the second embodiment.

FIG. 9 is a sectional view showing the cross-sectional shape of a (fifth) waveguide 610 of the second embodiment. As shown in FIG. 9, the waveguide 610 includes a first metallic member 612a and a second metallic member 612b. The first metallic member 612a is in contact with the first wall portion 110a and the third wall portion 110c. The second metallic member 612b is in contact with the first wall portion 110a and the fourth wall portion 110d. A small gap is formed between the first metallic member 612a and the second metallic member 612b. The slot 111 is disposed at a position determined such that the slot 111 is not closed by the first metallic member 612a and the second metallic member 612b. Namely, the slot 111 is provided in the first wall portion 110a at a position between the first metallic member 612a and the second metallic member 612b.

In this case, a surface of the first metallic member 612a facing toward the interior of the waveguide 610 is a first connection surface. A surface of the second metallic member 612b facing toward the interior of the waveguide 610 is a second connection surface. The first connection surface establishes connection between the slot 111 or the first conductor surface and the third conductor surface. The second connection surface establishes connection between the slot 111 or the first conductor surface and the fourth conductor surface.

2-2. Second Arrangement

Figure 10:
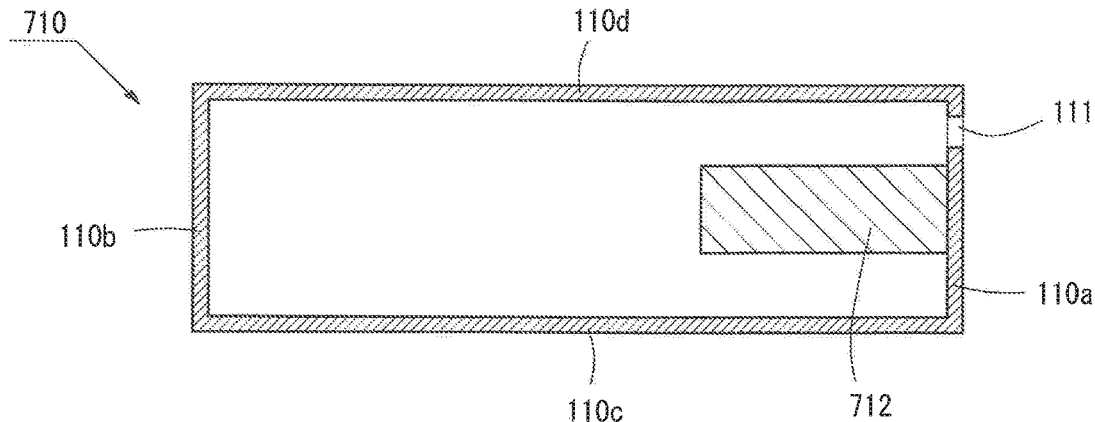
FIG. 10 Sectional view showing the cross-sectional shape of a sixth waveguide of the second embodiment.

FIG. 10 is a sectional view showing the cross-sectional shape of a (sixth) waveguide 710 of the second embodiment. As shown in FIG. 10, the waveguide 710 includes a metallic member 712. The metallic member 712 is a rectangular parallelepiped. The metallic member 712 is disposed at a location determined such that the metallic member 712 is in contact with the first wall portion 110a and is not in contact with any of the second wall portion 110b, the third wall portion 110c, and the fourth wall portion 110d. The slot 111 is formed in the first wall portion 110a at a location determined such that the slot 111 is not closed by the metallic member 712. In FIG. 10, the distance between the third wall portion 110c and the metallic member 712 is equal to the distance between the fourth wall portion 110d and the metallic member 712. However, the distance between the third wall portion 110c and the metallic member 712 and the distance between the fourth wall portion 110d and the metallic member 712 may differ from each other. The slot 111 may be formed at a position on the side toward the third wall portion 110c or a position on the side toward the fourth wall portion 110d.

Figure 11:
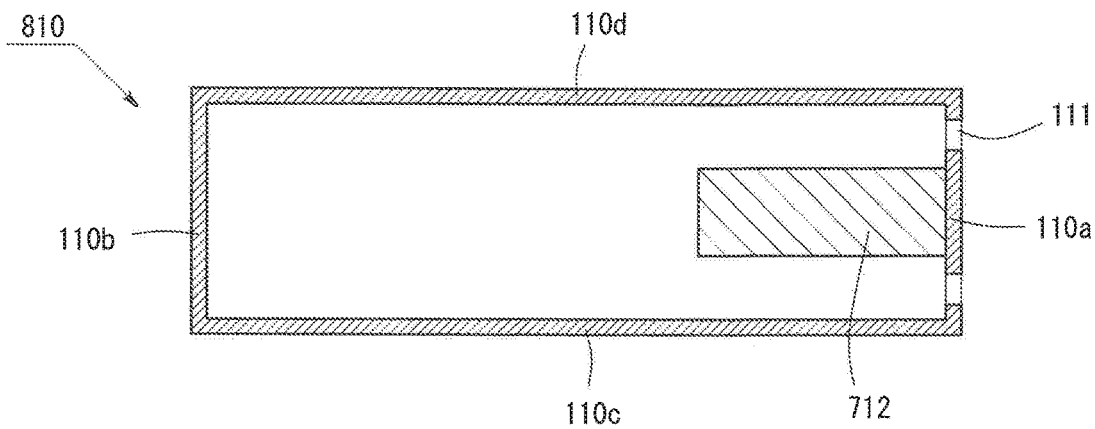
FIG. 11 Sectional view showing the cross-sectional shape of a seventh waveguide of the second embodiment.

FIG. 11 is a sectional view showing the cross-sectional shape of a (seventh) waveguide 810 of the second embodiment. As shown in FIG. 11, the waveguide 810 has two slots 111 formed in the first wall portion 110a.

3. Effect of the Present Embodiment

Even in the case where the metallic member 212, the metallic member 312, the metallic member 412, the metallic member 512, the metallic members 612a and 612b, or the metallic member 712 is used, the electric field intensity between the first portion E1a and the second portion E1b at the slot 111 is sufficiently large.

In the case of use of the above-described metallic members, the inter-metal distance within the waveguide is small on the side toward the first wall portion 110a in which the slot 111 is formed and is large on the side toward the second wall portion 110b in which the slot 111 is not formed.

By decreasing the inter-metal distance on the side toward the first wall portion 110a having the slot 111, the electric field intensity at the slot 111 can be increased.

4. Modification 4-1. Second Connection Surface

Instead of the first connection surface, a second connection surface for connecting the first conductor surface S1 and the fourth conductor surface S4 may be provided.

4-2. Combinations

The second embodiment and its modification may be combined freely with the first embodiment and its modification.

Third Embodiment

A third embodiment will be described. A waveguide of the third embodiment has a metallic member different from the metallic member of the waveguide of the first embodiment.

1. Shape of the Metallic Member

Figure 12:
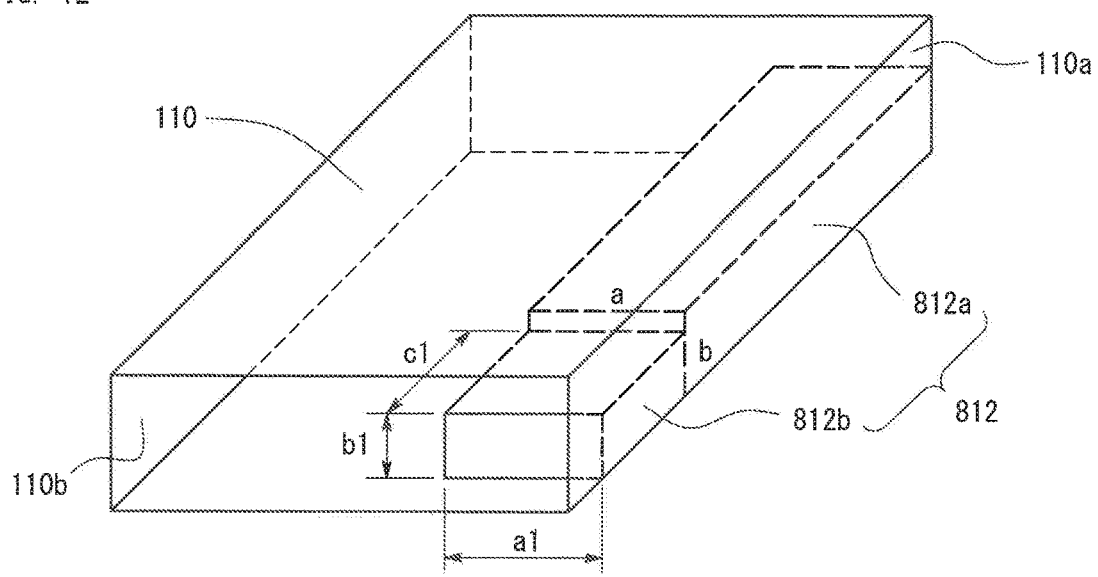
FIG. 12 See-through perspective view showing the structure of a waveguide of a third embodiment.

FIG. 12 is a see-through perspective view showing the structure of a waveguide 110 of a third embodiment. As shown in FIG. 12, the waveguide 110 includes a metallic member 812. The metallic member 812 has a main body portion 812a and an additional portion 812b. Each of the main body portion 812a and the additional portion 812b is a rectangular parallelepiped. The main body portion 812a and the additional portion 812b are integrated with each other. The additional portion 812b is disposed at a position adjacent to the main body portion 812a in a direction parallel to the transmission direction of the waveguide 110 such that the additional portion 812b is tandem with the main body portion 812a.

The width a1 of the additional portion 812b is the same as the width a of the main body portion 812a. The height b1 of the additional portion 812b is smaller than the height b of the main body portion 812a. The length c1 of the additional portion 812b is smaller than the length of the main body portion 812a.

2. Effect of the Metallic Member

The additional portion 812b prevents the microwave transmitted from the microwave generation unit 120 toward the waveguide 110 from being reflected toward the microwave generation unit 120. Therefore, the amount by which the microwave attenuates before reaching the location of the slot 111 is small. Also, the reflection waves toward the microwave generation unit 120 can be suppressed.

3. Modification 3-1. Two Additional Portions

The waveguide 110 shown in FIG. 12 has one additional portion 812b for the main body portion 812a. However, the waveguide 110 may have two additional portions 812b. In such a case, one additional portion 812b is disposed on one side of the main body portion 812a, and the other additional portion 812b is disposed on the other side of the main body portion 812a. This configuration advantageously suppresses reflection waves at opposite end portions of the main body portion 812a.

3-2. Combinations

The third embodiment and its modification may be freely combined with the first embodiment, the second embodiment, and their modifications.

Fourth Embodiment

A fourth embodiment will be described.

1. Shape of the Waveguide

Figure 13:
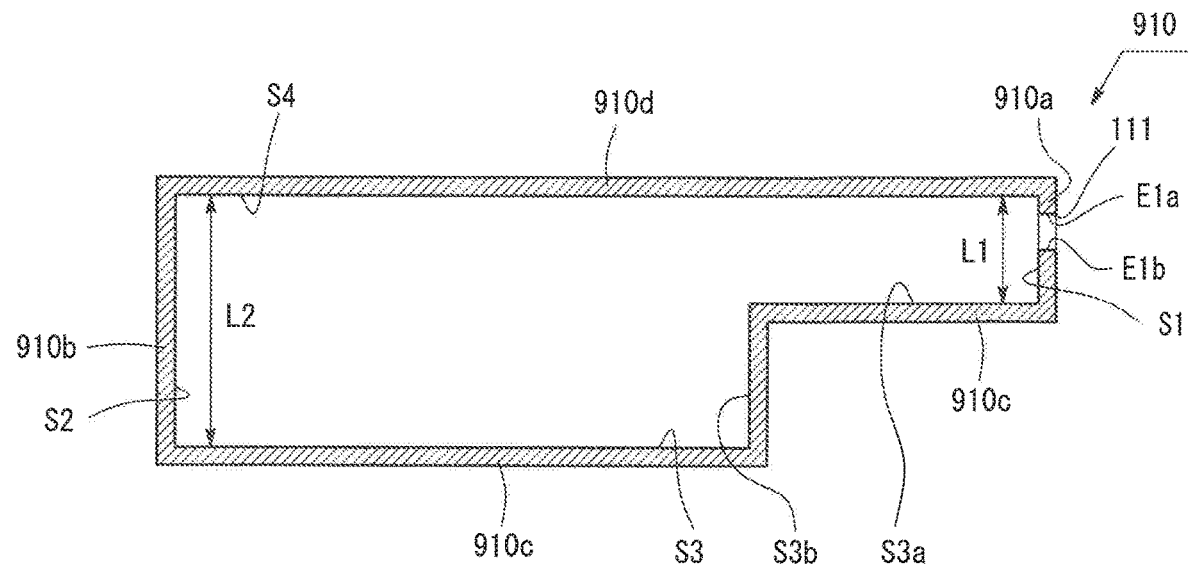
FIG. 13 Sectional view showing a cross section of a waveguide of a plasma generation apparatus of a fourth embodiment.

FIG. 13 shows a waveguide 910 of the fourth embodiment. The shape of the waveguide 910 is similar to the shape of a rectangular waveguide. The waveguide 910 has a first wall portion 910a, a second wall portion 910b, a third wall portion 910c, and a fourth wall portion 910d. The first wall portion 910a has the slot 111. Therefore, the first wall portion 910a has the first portion E1a and the second portion E1b. The first wall portion 910a and the second wall portion 910b face each other and extend in the transmission direction of the waveguide 910. The third wall portion 910c and the fourth wall portion 910d face each other and extend in the transmission direction of the waveguide 910.

The first wall portion 910a and the second wall portion 910b correspond to the shorter sides of a cross section of the waveguide 910 perpendicular to the transmission direction. The fourth wall portion 910d corresponds to a longer side of the cross section of the waveguide 910 perpendicular to the transmission direction. The third wall portion 910c is continuous with the first wall portion 910a and the second wall portion 910b. The fourth wall portion 910d is continuous with the first wall portion 910a and the second wall portion 910b.

The first wall portion 910a has a first conductor surface S1 facing toward the interior of the waveguide 910. The second wall portion 910b has a second conductor surface S2 facing toward the interior of the waveguide 910. The third wall portion 910c has a third conductor surface S3 facing toward the interior of the waveguide 910. The fourth wall portion 910d has a fourth conductor surface S4 facing toward the interior of the waveguide 910. The first conductor surface S1, the second conductor surface S2, the third conductor surface S3, and the fourth conductor surface S4 are identical to the first conductor surface S1, the second conductor surface S2, the third conductor surface S3, and the fourth conductor surface S4 of the first embodiment.

Accordingly, as shown in FIG. 13, the first length L1 (in the y direction) of the first conductor surface S1 in the cross section perpendicular to the z direction is smaller than the second length L2 (in the y direction) of the second conductor surface S2 in the cross section perpendicular to the z direction.

2. Effect

The conductor surfaces provided inside the waveguide 910 of the fourth embodiment are the same as the conductor surfaces provided inside the waveguide 110 of the first embodiment. Surface current flows through the respective conductor surfaces. Therefore, it is sufficient that the metal including the conductor surface has some thickness or more. Even when the waveguide 910 of the fourth embodiment is used, appropriate plasma can be generated at the slot 111 as in the case where the waveguide 110 of the first embodiment is used.

3. Modification

The fourth embodiment may be freely combined with the first embodiment, the second embodiment, the third embodiment, and their modifications.

Brief Summary of the Embodiments

Figure 14:
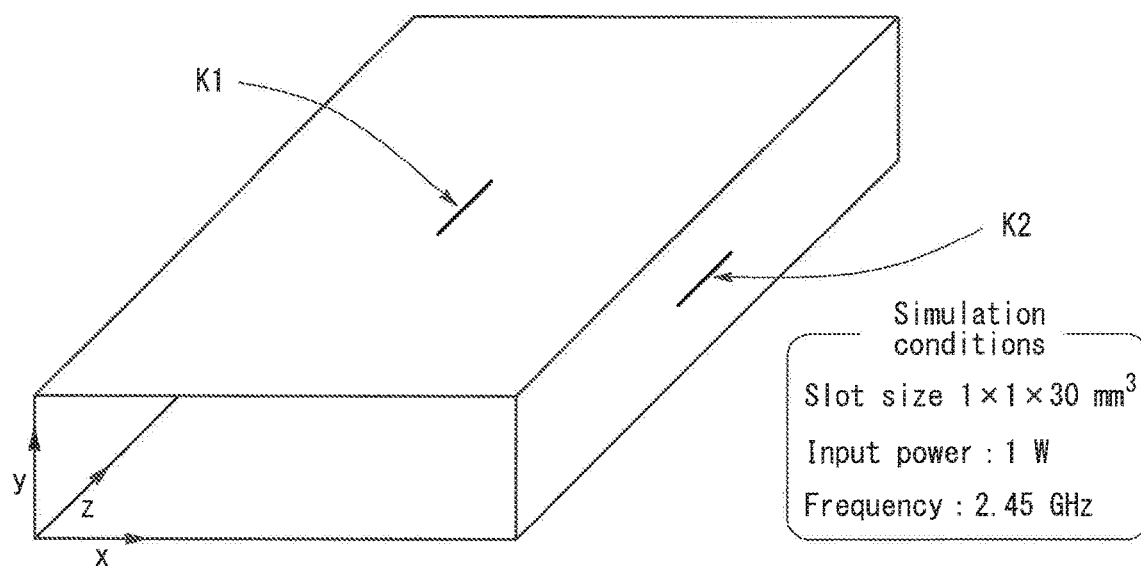
FIG. 14 View used for describing the shape of a rectangular waveguide used for simulation.

Each plasma generation apparatus includes a waveguide extending in the z direction in the xyz rectangular coordinate system of FIG. 14, and a microwave generation unit for generating a microwave which propagates through the waveguide in the z direction. The waveguide has a first conductor surface facing toward the interior of the waveguide, a second conductor surface facing toward the interior of the waveguide, and a slot extending from the first conductor surface to the outside of the waveguide. The first conductor surface and the second conductor surface electrically communicate with each other and face each other. The first length (in the y direction) of the first conductor surface in a cross section perpendicular to the z direction is smaller than the second length (in the y direction) of the second conductor surface in the cross section perpendicular to the z direction. The first length includes the length (in the y direction) of the slot in the cross section perpendicular to the z direction. The second length is smaller than the distance between the first conductor surface and the second conductor surface in the x direction. Each of the first conductor surface and the second conductor surface contains a surface parallel to the yz plane. Alternatively, each of the first conductor surface and the second conductor surface may be a surface parallel to the yz plane.

The waveguide has a third conductor surface and a fourth conductor surface which face toward the interior of the waveguide, are continuous with the second conductor surface, and face each other. The waveguide has at least one of a first connection surface and a second connection surface. Each of the third conductor surface and the fourth conductor surface contains a surface parallel to the xz plane. The first connection surface establishes connection between the slot or the first conductor surface and the third conductor surface. The second connection surface establishes connection between the slot or the first conductor surface and the fourth conductor surface.

The distance between the first connection surface and the fourth conductor surface increases with the distance from the first conductor surface (for example, FIG. 5 to FIG. 8).

The distance between the second connection surface and the third conductor surface increases with the distance from the first conductor surface (for example, FIG. 5 to FIG. 8).

Alternatively, the waveguide has a third conductor surface and a fourth conductor surface which face toward the interior of the waveguide, are continuous with the second conductor surface, and face each other, a fifth conductor surface which faces toward the interior of the waveguide and faces a portion of the third conductor surface, and a sixth conductor surface which faces toward the interior of the waveguide and faces a portion of the fourth conductor surface. Each of the third conductor surface and the fourth conductor surface contains a surface parallel to the xz plane. The length of the fifth conductor surface in the x direction and the length of the sixth conductor surface in the x direction are smaller than the distance between the first conductor surface and the second conductor surface (for example, FIG. 10 and FIG. 11).

Figure 16:
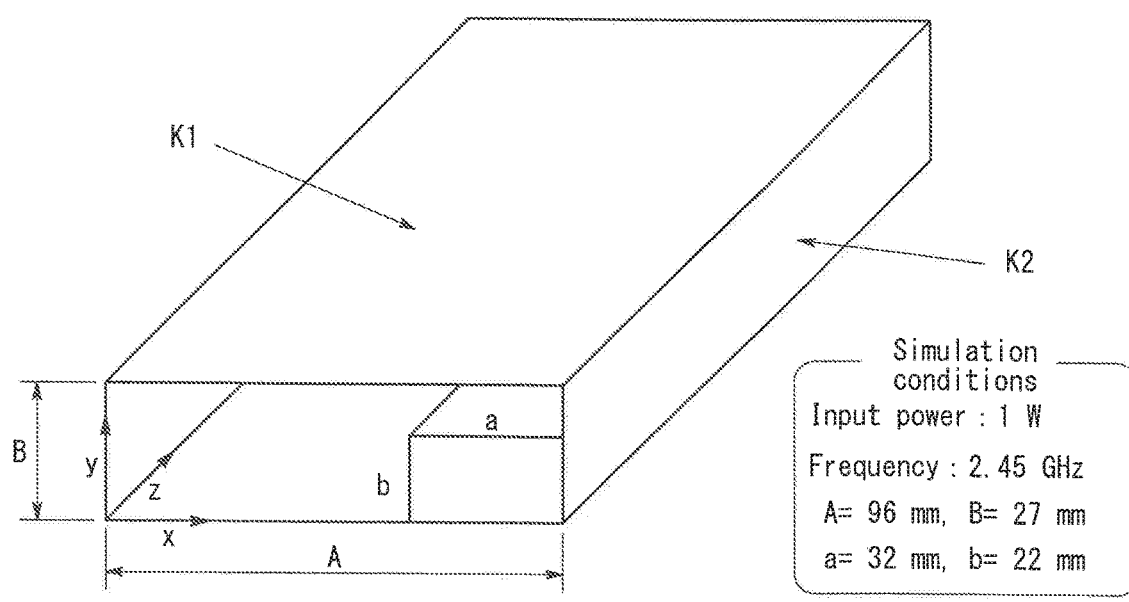
FIG. 16 View used for describing the shape of a waveguide used for simulation.

Alternatively, the waveguide has a third conductor surface and a fourth conductor surface which face toward the interior of the waveguide, are continuous with the second conductor surface, and face each other, a fifth conductor surface which faces toward the interior of the waveguide and is continuous with the first conductor surface, and a sixth conductor surface which faces toward the interior of the waveguide and is continuous with the third conductor surface. The sixth conductor surface is located between the third conductor surface and the fifth conductor surface. The waveguide satisfies the following equation:

$$0.24 \cdot A - 3.6 \leq a \leq 0.56 \cdot A - 8.4$$

where A is the distance between the first conductor surface and the second conductor surface in a cross section of the waveguide perpendicular to the transmission direction, and a is the distance between the first conductor surface and the sixth conductor surface in the cross section of the waveguide perpendicular to the transmission direction (for example, FIG. 16).

The waveguide has a seventh surface at a position adjacent to the fifth conductor surface in the z direction. The distance between the seventh conductor surface and the fourth conductor surface is larger than the distance between the fifth conductor surface and the fourth conductor surface (for example, FIG. 12).

The slot is formed such that the angle of the longitudinal direction of the slot in relation to the transmission direction of the waveguide is not 90°.

(Simulation)
1. Relation Between a Rectangular Waveguide and the Position of its Slot FIG. 14 is a view used for describing the shape of a rectangular waveguide used for simulation. The x-axis corresponds to the longer-side direction in a cross section of the rectangular waveguide perpendicular to the center axis thereof. The y-axis corresponds to the shorter-side direction in the cross section of the rectangular waveguide perpendicular to the center axis thereof. The z-axis corresponds to a direction parallel to the center axis of the rectangular waveguide. The microwave propagates through the rectangular waveguide while being reflected by the inner wall of the rectangular waveguide. The longer-side direction of the slot is parallel to the z-axis.

The position of the slot will be described. As shown in FIG. 14, simulation was performed for the case where the slot was provided on a longer side (K1 of FIG. 14) and the case where the slot was provided on a shorter side (K2 of FIG. 14). The length of the slot in the longer-side direction (the z-axis direction) is 30 mm. The length of the slot in the shorter-side direction is 1 mm. The wall thickness of the rectangular waveguide is 1 mm. Input power is 1 W. The frequency of the microwave is 2.45 GHz.

Figure 15:
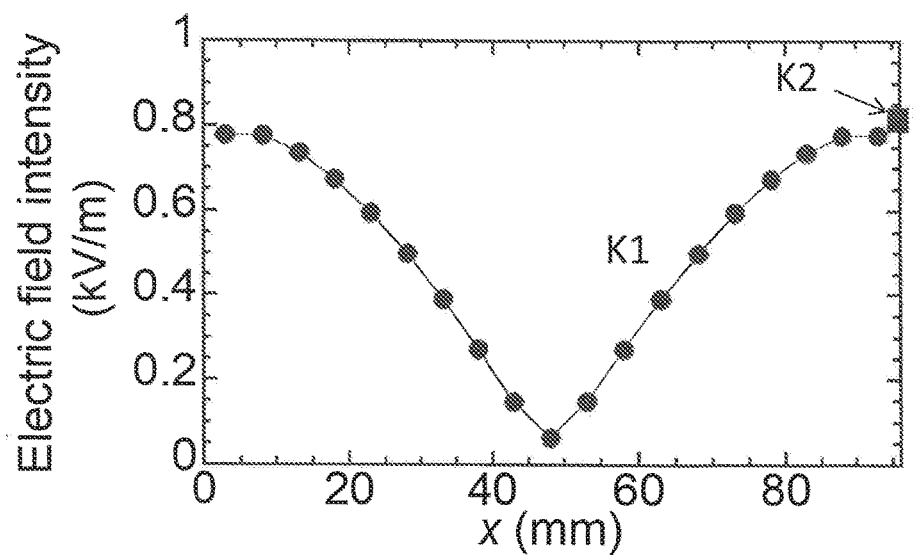
FIG. 15 Graph showing the relation between the electric field intensity within a slot and its position in an x-axis direction in the rectangular waveguide.

FIG. 15 is a graph showing the relation of the position in the x axial direction and the electric field intensity within the slot. The horizontal axis of FIG. 15 represents the position (mm) of the slot in the x axial direction. The vertical axis of FIG. 15 represents the electric field intensity within the slot; namely, the electric field intensity between the first portion E1$a$ and the second portion E1$b$. K1 of FIG. 15 shows the case where the slot is provided on the surface indicated by K1 in FIG. 14 (hereinafter referred to as the K1 surface). K2 of FIG. 15 shows the case where the slot is provided on the surface indicated by K2 in FIG. 14 (hereinafter referred to as the K2 surface). The microwave propagates through the waveguide in the $TE_{10}$ mode. Therefore, the electric field intensity is constant irrespective of the position of the slot on the K2 surface of FIG. 14.

As shown in FIG. 15, the electric field intensity within the slot provided on the K1 surface of FIG. 14 is weak when the slot is located near the center in the longer side, and is strong when the slot is located near either end of the longer side. The electric field intensity within the slot becomes the maximum when the slot is located at one of the opposite ends of the longer side.

Also, as shown in FIG. 15, the electric field intensity within the slot in the case where the slot is provided on the shorter side is larger than the electric field intensity within the slot in the case where the slot is provided on the longer side. As described above, when the slot is provided on the shorter side, the electric field intensity is constant irrespective of the position. Therefore, providing the slot on the shorter side is more preferred than providing the slot on the longer side. This is because a higher electric field intensity can be obtained within the slot.

2. Metallic Member

Next, the result of simulation performed on the waveguide 110 of the first embodiment having a metallic member will be described.

2-1. Metallic Member and Electric Field Intensity

FIG. 16 is a view used for describing the shape of a waveguide used for simulation. The x-axis corresponds to the longer-side direction in a cross section of the waveguide perpendicular to the center axis thereof. The y-axis corresponds to the shorter-side direction in the cross section of the waveguide perpendicular to the center axis thereof. The z-axis corresponds to a direction parallel to the center axis of the waveguide.

The length A in the longer-side direction is 96 mm. The length B in the shorter-side direction is 27 mm. The length a of the metallic member 112 in a longer-side direction is 32 mm. The length b of the metallic member 112 in the shorter-side direction is 22 mm. The length of the slot in the longer-side direction (the z-axis direction) is 30 mm. The length of the slot in the shorter-side direction is 1 mm. The wall thickness of the rectangular waveguide is 1 mm. Input power is 1 W. The frequency of the microwave is 2.45 GHz.

Figure 17:
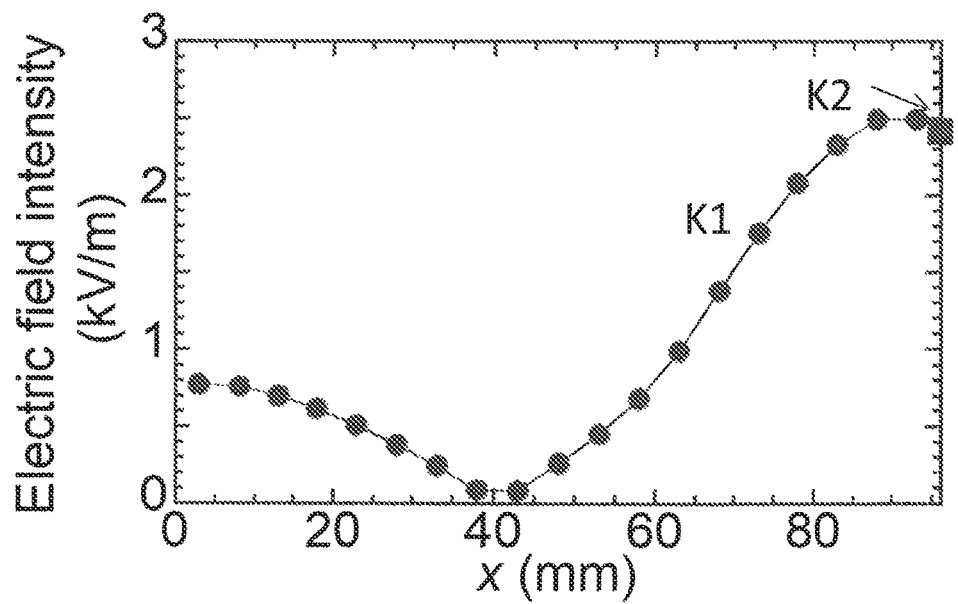
FIG. 17 Graph showing the relation between electric field intensity and the position of the slot in the x-axis direction in the waveguide having a metallic member.

FIG. 17 is a graph showing the relation between electric field intensity and the position of the slot in the x-axis direction in the waveguide having a metallic member. The horizontal axis of FIG. 17 represents the position (mm) of the slot in the x axial direction. The vertical axis of FIG. 17 represents the electric field intensity (kV/m) in the waveguide. As shown in FIG. 16, the metallic member 112 is disposed in a region of (64≤x≤96, 0≤y≤22) on the xy plane.

In this case, due to presence of the metallic member 112, the electric field intensity becomes very strong in a region of x≥60 mm. The electric field intensity at the position of x=96 mm in the case where the metallic member 112 is present is about 2.5 kV/m. The electric field intensity at the position of x=96 mm in the case where the metallic member 112 is absent is about 0.8 kV/m. Accordingly, due to presence of the metallic member 112, the electric field intensity at the position of x=96 mm becomes 3.1 times.

2-2. Relation Between the Width of the Waveguide and the Width of the Metallic Member The relation of the width A of the waveguide and the width a of the metallic member 112 will be described. The width A of the waveguide is the distance between the first conductor surface and the second conductor surface in a cross section of the waveguide perpendicular to the transmission direction. The width a of the metallic member 112 is the width of the metallic member 112 in the longer-side direction in the cross section of the waveguide perpendicular to the transmission direction. The height B of the waveguide is 27 mm. Input power is 1 W. The frequency of the microwave is 2.45 GHz.

Figure 18:
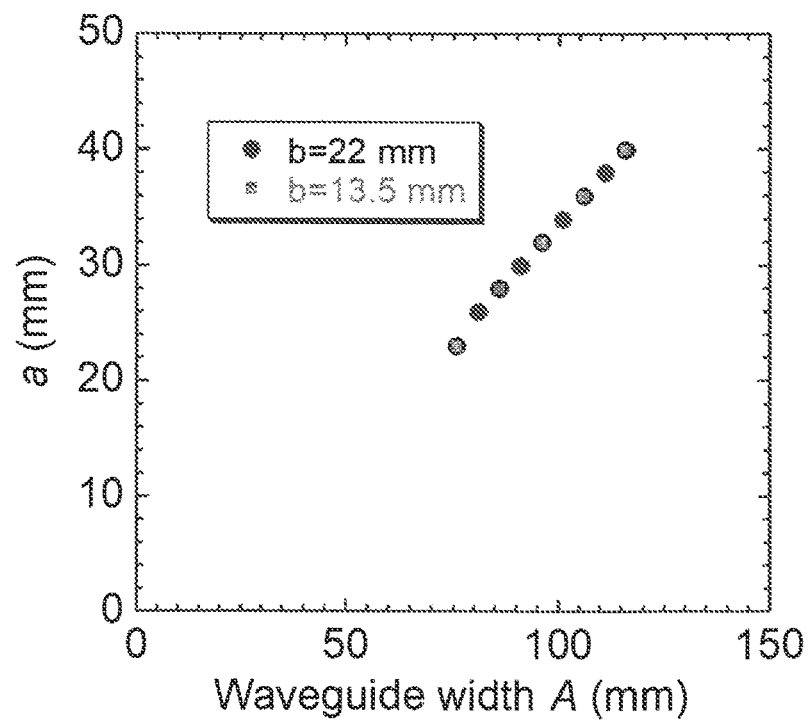
FIG. 18 First graph showing the relation between the width of the waveguide and the width of the metallic member.

FIG. 18 is a first graph showing the relation between the width A of the waveguide and the width a of the metallic member 112. The horizontal axis of FIG. 18 represents the width A (mm) of the waveguide. The vertical axis of FIG. 18 represents the width a (mm) of the metallic member 112 for realizing the maximum current density for the width A (mm) of the waveguide. The width a (mm) of the metallic member 112 for realizing the maximum current density refers to the width a (mm) of the metallic member 112 at which current density becomes the maximum in a graph which is drawn to show the relation between the width a and the current density with the width A fixed. The relation between the width A and the width a was plotted for the case where the height b of the metallic member 112 was 22 mm and the case where the height b of the metallic member 112 was 13.5 mm.

As shown in FIG. 18, the width a (mm) of the metallic member 112 for realizing the maximum current density for the width A (mm) of the waveguide does not depend on the height b of the metallic member 112.

Next, there will be described the result of simulation performed for the case where the height B of the waveguide and the width b of the metallic member 112 were fixed and the frequency of the microwave was changed.

Figure 19:
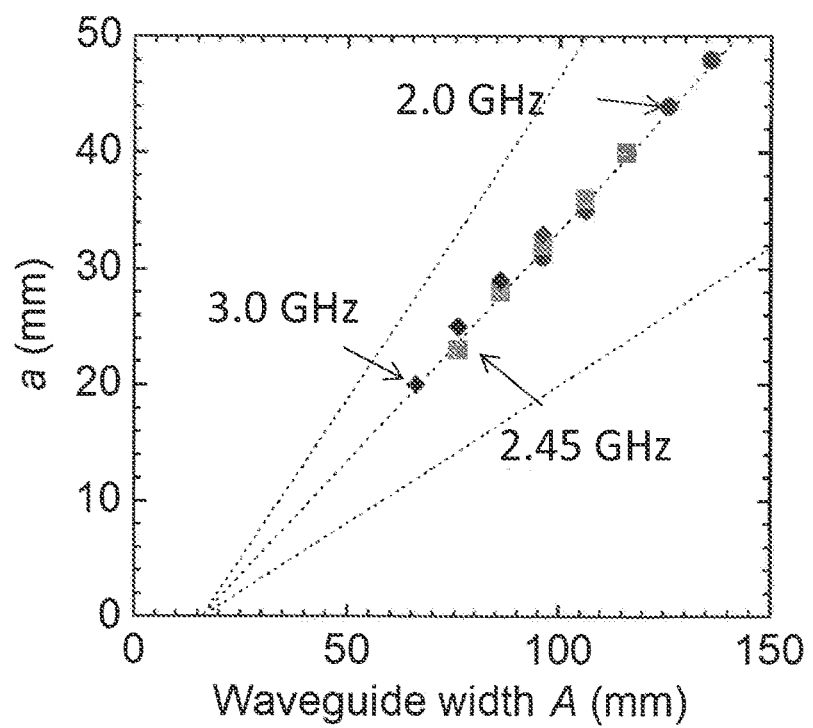
FIG. 19 Second graph showing the relation between the width of the waveguide and the width of the metallic member.

FIG. 19 is a second graph showing the relation between the width A of the waveguide and the width a of the metallic member 112. The horizontal axis of FIG. 19 represents the width A (mm) of the waveguide. The vertical axis of FIG. 19 represents the width a (mm) of the metallic member 112 for realizing the maximum current density for the width A (mm) of the waveguide. The relation between the width A and the width a was plotted for the case where the frequency of the microwave was 2.0 GHz, the case where the frequency of the microwave was 2.45 GHz, and the case where the frequency of the microwave was 3.0 GHz.

As shown in FIG. 19, the width a (mm) of the metallic member 112 for realizing the maximum current density for the width A (mm) of the waveguide does not depend on the frequency of the microwave.

The width a (mm) of the metallic member 112 for realizing the maximum current density for the width A (mm) of the waveguide is represented by the following equation.

$$a = 0.4 \cdot A - 6 \quad (2)$$

Equation (2) represents a straight line for approximating dots representing the width a (mm) of the metallic member 112 for realizing the maximum current density for the width A (mm) of the waveguide. Namely, when Equation (2) is satisfied, the electric field intensity between the first portion E1a and the second portion E1b at the slot 111 becomes the maximum.

In actuality, the relation between the width A of the waveguide and the width a of the metallic member 112 may be within a range of ±40% deviation from Equation (2). The following Equation (3) shows the range of ±40% deviation from Equation (2).

$$0.24 \cdot A - 3.6 \leq a \leq 0.56 \cdot A - 8.4 \quad (3)$$

Even in the case where the relation falls within the range represented by Equation (3), the electric field intensity between the first portion E1a and the second portion E1b at the slot 111 assumes a sufficiently high value.

The relation between the width A of the waveguide and the width a of the metallic member 112 may be within a range of ±20% deviation from Equation (2). In this case, the electric field intensity between the first portion E1a and the second portion E1b at the slot 111 assumes a value higher than the value in the case where the relation falls within the range represented by Equation (3). The following Expression (4) shows the range of ±20% deviation from Equation (2).

$$0.32 \cdot A - 4.8 \leq a \leq 0.48 \cdot A - 7.2 \quad (4)$$

3. Mode of Microwave

In general, an electromagnetic wave within a waveguide is transmitted in the $TE_{10}$ mode. This is because transmission in many modes increases the energy loss of the electromagnetic wave. A microwave is transmitted in the $TE_{10}$ mode when the following expressions are satisfied.

$$v_0/2f < A < v_0/f$$

$$B < v_0/2f$$

In these expressions, $v_0$ represents the speed of light in vacuum, and f represents the frequency of the microwave.

4. Surface Current within a Waveguide

Figure 20:
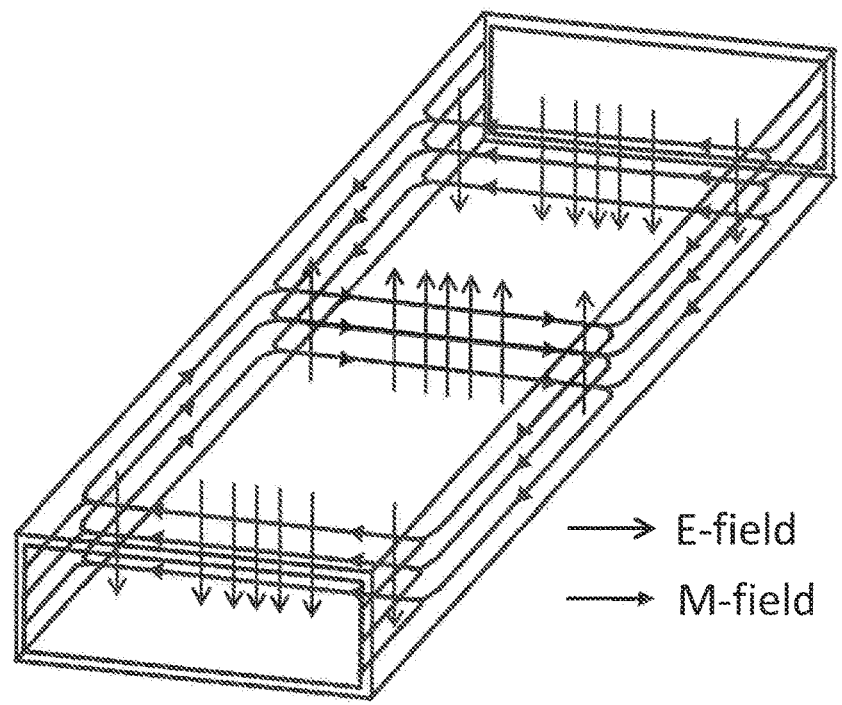
FIG. 20 Illustration schematically showing electric fields and magnetic fields formed inside a waveguide during propagation of a microwave therethrough.

FIG. 20 is an illustration schematically showing electric fields and magnetic fields formed inside a waveguide during propagation of a microwave therethrough. The electric fields are formed to be directed upward or downward in FIG. 20. The magnetic fields are formed to swirl perpendicularly to the electric fields.

Figure 21:
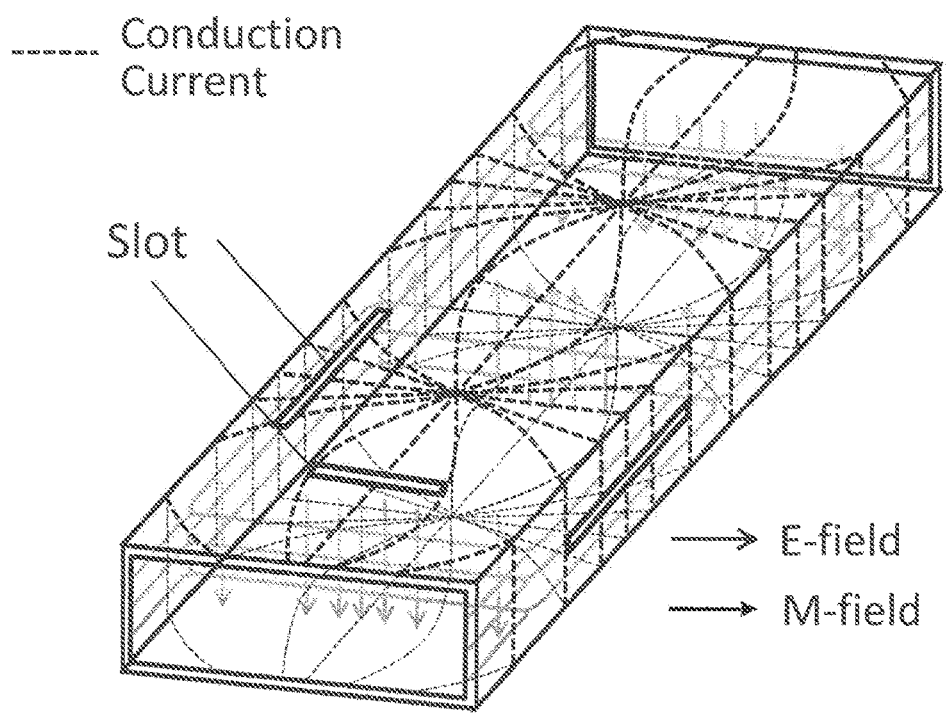
FIG. 21 Illustration showing the direction of currents flowing along an inner surface of the waveguide when the electric and magnetic fields shown in FIG. 20 are formed.

FIG. 21 is an illustration showing the directions of currents flowing along an inner surface of the waveguide when the electric and magnetic fields shown in FIG. 20 are formed. Broken lines in FIG. 21 show the flows of currents.

5. Discharge Start Electric Field

Figure 22:
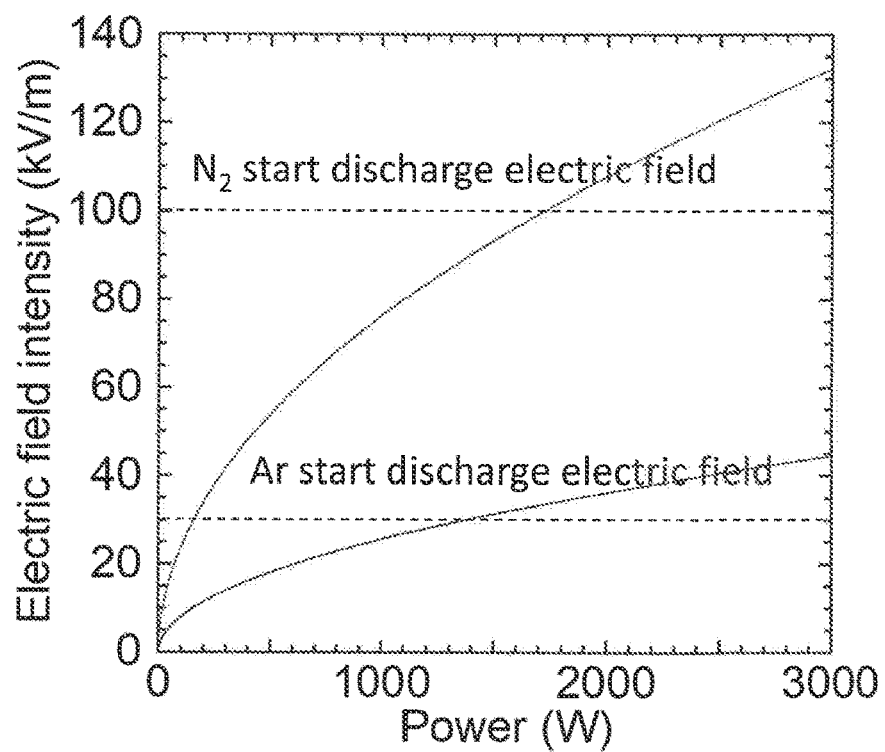
FIG. 22 Graph showing the relation between the power of the microwave and the intensity of the electric field formed at the slot in the plasma generation apparatus of the first embodiment and in a conventional plasma generation apparatus.

FIG. 22 is a graph showing the relation between the power of the microwave and the intensity of the electric field formed at the slot in the plasma generation apparatus of the first embodiment and in a conventional plasma generation apparatus. The horizontal axis of FIG. 22 represents the output of the microwave power supply 120. The vertical axis of FIG. 22 represents the electric field intensity at the slot.

The discharge start voltage of Ar gas is about 30 kV/m. The discharge start voltage of nitrogen gas is about 100 kV/m. As shown in FIG. 22, although the conventional plasma generation apparatus can convert Ar gas to plasma by using a microwave of about 1400 W, the conventional plasma generation apparatus cannot convert nitrogen gas to plasma by using a microwave of about 3000 W. The plasma generation apparatus 100 of the first embodiment can convert Ar gas to plasma by using a microwave of about 200 W, and can convert nitrogen gas to plasma by using a microwave of about 1700 W.

As shown in FIG. 22, in general, it is difficult to convert a molecular gas such as nitrogen gas by a plasma generation apparatus using a microwave because a strong electric field is needed to start discharge. As will be described in relation to an experiment, the plasma generation apparatus 100 can use not only noble gas but also molecular gas as plasma gas.

6. Influence of the Metallic Member

Simulation was performed for the case where a metallic member is disposed in a waveguide. The simulation was performed under conditions described below. The width (inner width) of the waveguide is 96 mm. The height (inner width) of the waveguide is 27 mm. The width of the metallic member is 32 mm. The height of the metallic member is 22 mm. The input power of the microwave is 1 W. The frequency of the microwave is 2.45 GHz.

6-1. Electric Field Intensity Inside the Waveguide

Figure 23:
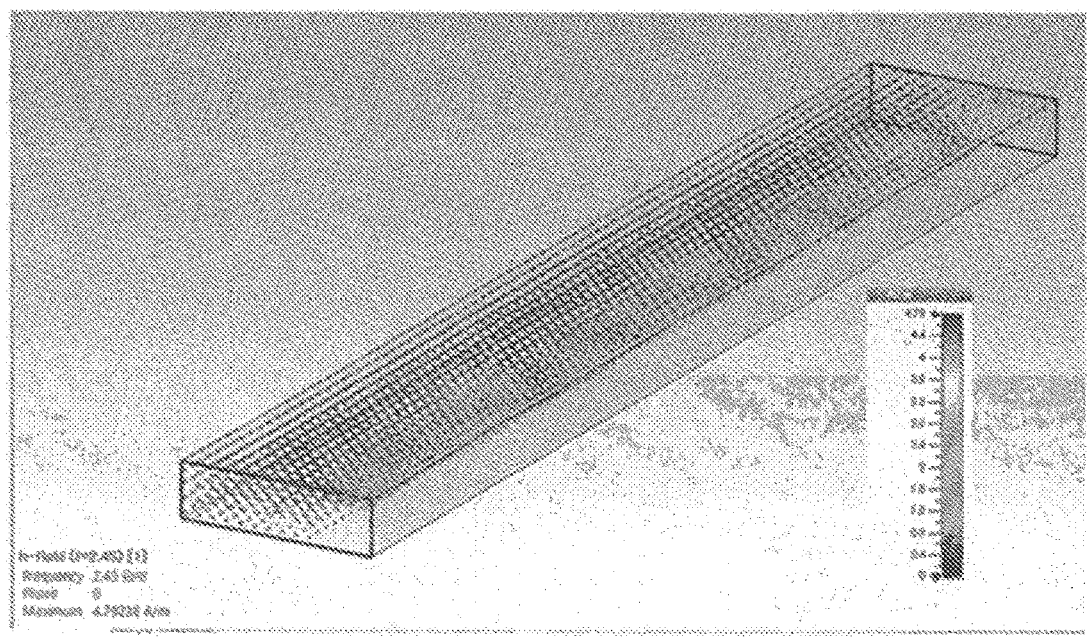
FIG. 23 Result of the simulation showing the electric field intensity within the waveguide of the plasma generation apparatus of the first embodiment.

FIG. 23 is the result of the simulation showing the electric field intensity within the waveguide of the plasma generation apparatus 100 of the first embodiment. In FIG. 23, a metallic member is disposed in the waveguide to be located on the right side of FIG. 23. In this case, the electric field intensity is high around the metallic member. Namely, this result is consistent with FIG. 17.

6-2. Scattering Parameters

Next, simulation was performed on scattering parameters. The scattering parameters are part of the elements of a scattering matrix. At that time, the scattering parameters were calculated for the case where the waveguide of the plasma generation apparatus 100 of the first embodiment was used alone and the case where the waveguide of the first embodiment and an ordinary waveguide were connected together. In the plasma generation apparatus 100, ordinary waveguides and a waveguide having a metallic member are connected together. Therefore, the scattering parameter in the state in which the waveguide having a metallic member is connected to the ordinary waveguides is important.

Figure 24:
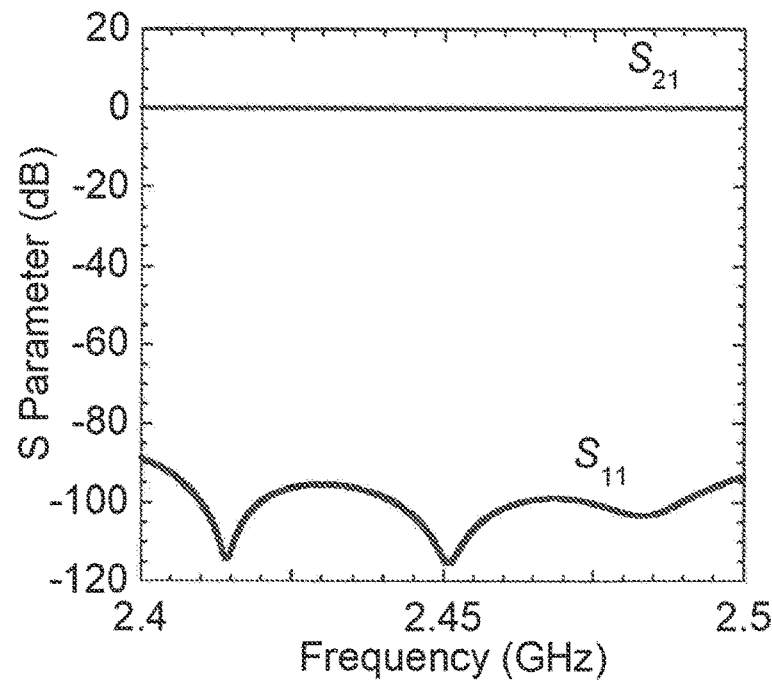
FIG. 24 Graph showing the scattering parameter of a metallic member-equipped waveguide alone.

FIG. 24 is a graph showing the scattering parameter of a metallic member-equipped waveguide alone. The horizontal axis of FIG. 24 represents the frequency of the input microwave. The vertical axis of FIG. 24 represents the scattering parameter. The conditions are identical with those shown in FIG. 16. As shown in FIG. 24, $S_{21}$ is approximately 0 dB, and $S_{11}$ representing the ratio of reflection waves is −80 dB or lower. As described above, the ratio of reflection waves is very small.

Next, the scattering parameter for the case where the metallic-member-equipped waveguide was connected to an ordinary waveguide was calculated. In this case, reflection waves were generated.

Figure 25:
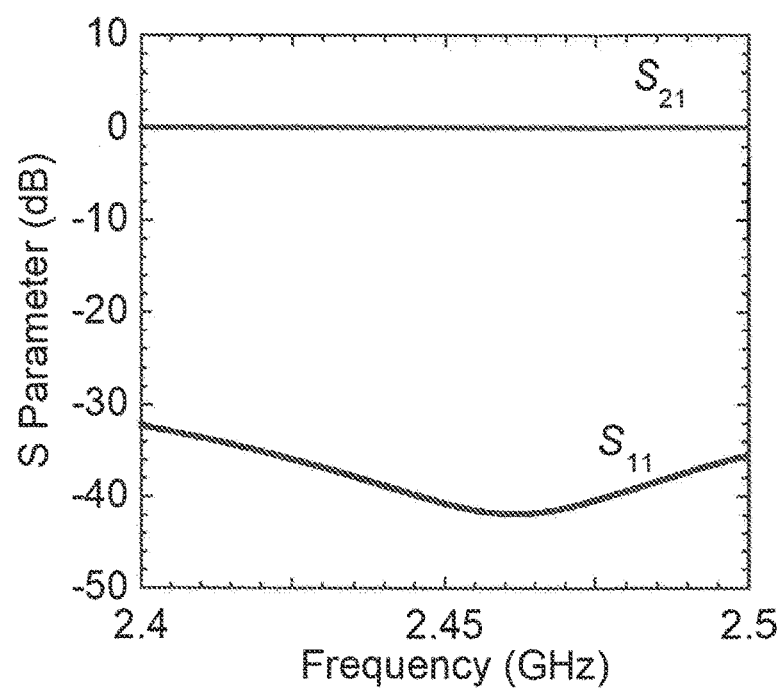
FIG. 25 Graph showing the scattering parameter in the case where a waveguide having a metallic member with an additional portion and an ordinary waveguide are connected.

FIG. 25 is a graph showing the scattering parameter in the case where a waveguide having a metallic member with an additional portion and an ordinary waveguide are connected. The horizontal and vertical axes of FIG. 25 are the same as those of FIG. 24. The sizes of respective portions are the same as those of FIG. 12. Other conditions are identical with those shown in FIG. 16. As shown in FIG. 25, $S_{21}$ is approximately 0 dB, and $S_{11}$ representing the ratio of reflection waves is −30 dB or lower. As described above, the ratio of reflection waves is sufficiently small.

Experiments

1. Experiment 1 (Noble Gas)

1-1. Method of Experiment

Plasma was generated by using the plasma generation apparatus 100 of the first embodiment. The cross-sectional shape of the waveguide was the same as that of FIG. 2. The length of the slot was 1.1 m. The width of the slot was 0.1 mm. The output of the microwave power supply 120 was 0.5 kW. The plasma gas was Ar gas. The flow rate of the Ar gas was 14 slm.

1-2. Result of Experiment

Figure 26:
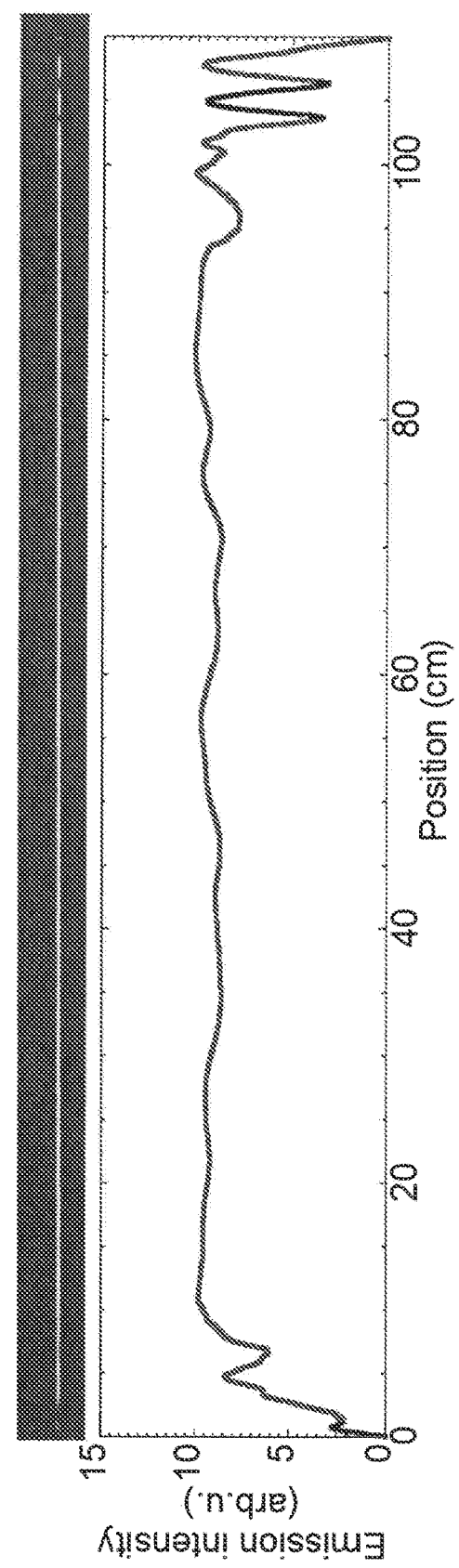
FIG. 26 First combination of a photograph showing plasma generated by the plasma generation apparatus and a graph showing the emission intensity of plasma.

FIG. 26 is a first combination of a photograph showing plasma generated by the plasma generation apparatus 100 and a graph showing the emission intensity of plasma. A photograph of generated plasma is shown in an upper section of FIG. 26. A graph showing the emission intensity of plasma is shown in a lower section of FIG. 26. The horizontal axis of FIG. 26 represents the position along the slot of the plasma generation apparatus 100. The vertical axis of FIG. 26 represents the emission intensity of plasma. The emission intensity of plasma at a certain position means the time average of intensity of light emitted by the plasma at that position.

The left end of FIG. 26 corresponds to the side where the microwave is input (hereinafter referred to as the "microwave input side"). As shown in FIG. 26, the emission intensity of plasma was approximately constant over the entire length of the slot. Therefore, plasma treatment can be performed at a time for an elongated region having a length of about 1 m.

2. Experiment 2 (Molecular Gas)

1-1. Method of Experiment

Plasma was generated by using the plasma generation apparatus 100 of the first embodiment. The cross-sectional shape of the waveguide was the same as that of FIG. 2. The length of the slot was 0.8 m. The width of the slot was 0.1 mm. The output of the microwave power supply 120 was 5.0 kW. The plasma gas was $N_2$ gas. The flow rate of the $N_2$ gas was 10 slm.

2-2. Result of Experiment

Figure 27:
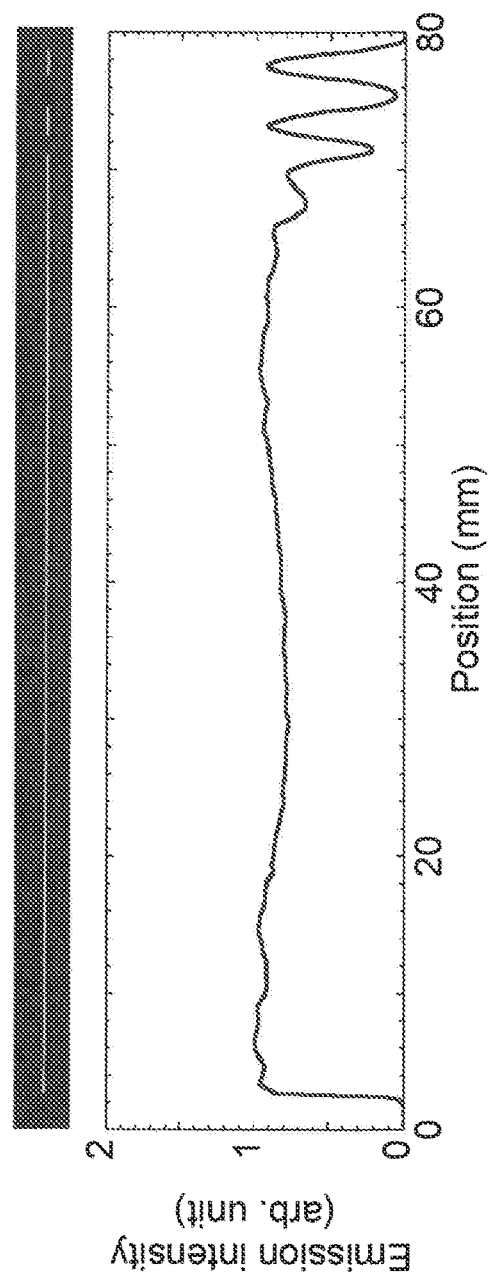
FIG. 27 Second combination of a photograph showing plasma generated by the plasma generation apparatus and a graph showing the emission intensity of plasma.

FIG. 27 is a second combination of a photograph showing plasma generated by the plasma generation apparatus 100 and a graph showing the emission intensity of plasma. A photograph of generated plasma is shown in an upper section of FIG. 27. A graph showing the emission intensity of plasma is shown in a lower section of FIG. 27. The horizontal axis of FIG. 27 represents the position along the slot of the plasma generation apparatus 100. The vertical axis of FIG. 27 represents the emission intensity of plasma.

The left end of FIG. 27 corresponds to the microwave input side. As shown in FIG. 27, the emission intensity of plasma was approximately constant over the entire length of the slot. Therefore, plasma treatment can be performed at a time for an elongated region having a length of about 1 m.

3. Summary of Experiments

As described above, the plasma generation apparatus 100 of the first embodiment can use, as plasma gas, not only noble gas such as Ar gas but also molecular gas such as nitrogen gas. Therefore, the plasma generation apparatus 100 can apply various types of plasmas to materials to be treated. Namely, the plasma treatment device 100 can be used for a variety of applications.

As shown in FIGS. 26 and 27, a region in which the emission intensity of plasma is somewhat instable is present on the side opposite the microwave input side. However, a wide stable region extends from the microwave input side. Therefore, when the plasma generation apparatus is utilized industrially, it is preferred that the plasma in the stable region is applied to a material to be treated, and the plasma in the instable region is not applied to the material to be treated.

Additional Notes

The plasma generation apparatus according to the first aspect includes a waveguide extending in the z direction in the xyz rectangular coordinate system, and a microwave generation unit for generating a microwave which propagates through the waveguide in the z direction. The waveguide comprises a first conductor surface facing toward the interior of the waveguide, a second conductor surface facing toward the interior of the waveguide, and a slot extending from the first conductor surface to the outside of the waveguide. The first conductor surface and the second conductor surface electrically communicate with each other and face each other. The first length (in the y direction) of the first conductor surface in a cross section perpendicular to the z direction is smaller than the second length (in the y direction) of the second conductor surface in the cross section perpendicular to the z direction. The first length includes the length (in the y direction) of the slot in the cross section perpendicular to the z direction. The second length is smaller than the distance between the first conductor surface and the second conductor surface in the x direction.

In the plasma generation apparatus according to the second aspect, each of the first conductor surface and the second conductor surface is a surface parallel to the yz plane.

In the plasma generation apparatus according to the third aspect, the waveguide comprises a third conductor surface and a fourth conductor surface which face toward the interior of the waveguide, are continuous with the second conductor surface, and face each other, and at least one of a first connection surface and a second connection surface. Each of the third conductor surface and the fourth conductor surface comprises a surface parallel to the xz plane. The first connection surface establishes connection between the slot or the first conductor surface and the third conductor surface. The second connection surface establishes connection between the slot or the first conductor surface and the fourth conductor surface.

In the plasma generation apparatus according to the fourth aspect, the distance between the first connection surface and the fourth conductor surface increases with the distance from the first conductor surface.

In the plasma generation apparatus according to the fifth aspect, the distance between the second connection surface and the third conductor surface increases with the distance from the first conductor surface.

In the plasma generation apparatus according to the sixth aspect, the waveguide comprises a third conductor surface and a fourth conductor surface which face toward the interior of the waveguide, are continuous with the second conductor surface, and face each other, a fifth conductor surface which faces toward the interior of the waveguide and faces a portion of the third conductor surface, and a sixth conductor surface which faces toward the interior of the waveguide and faces a portion of the fourth conductor surface. Each of the third conductor surface and the fourth conductor surface comprises a surface parallel to the xz plane. The length of the fifth conductor surface in the x direction and the length of the sixth conductor surface in the x direction are smaller than the distance between the first conductor surface and the second conductor surface.

In the plasma generation apparatus according to the seventh aspect, the waveguide comprises a third conductor surface and a fourth conductor surface which face toward the interior of the waveguide, are continuous with the second conductor surface, and face each other, a fifth conductor surface which faces toward the interior of the waveguide and is continuous with the first conductor surface, and a sixth conductor surface which faces toward the interior of the waveguide and is continuous with the third conductor surface. The sixth conductor surface is located between the third conductor surface and the fifth conductor surface. The waveguide satisfies the following equation:

$$0.24 \cdot A - 3.6 \leq a \leq 0.56 \cdot A - 8.4$$

where A is the distance between the first conductor surface and the second conductor surface in a cross section of the waveguide perpendicular to the transmission direction, and a is the distance between the first conductor surface and the sixth conductor surface in the cross section of the waveguide perpendicular to the transmission direction.

In the plasma generation apparatus according to the eighth aspect, the waveguide comprises a seventh surface at a position adjacent to the fifth conductor surface in the z direction. The distance between the seventh conductor surface and the fourth conductor surface is larger than the distance between the fifth conductor surface and the fourth conductor surface.

In the plasma generation apparatus according to the ninth aspect, the slot is formed such that the angle of the longitudinal direction of the slot in relation to the transmission direction of the waveguide is not 90°.

DESCRIPTION OF REFERENCE NUMERALS

100: plasma generation apparatus
110: waveguide
110a: first wall portion 110b: second wall portion
110c: third wall portion
110d: fourth wall portion
111: slot
112, 212, 312, 412, 512, 612a, 612b, 712: metallic member
120: microwave generation unit
130: isolator
140: power monitor
150: EH tuner
160: termination unit
171, 172, 173, 174: connection waveguide
181, 182: pressure window waveguide
190: gas supply unit

The invention claimed is:

1. A plasma generation apparatus comprising:
a waveguide extending in a z direction in an xyz rectangular coordinate system; and
a microwave generation unit for generating a microwave which propagates through the waveguide in the z direction, wherein
the waveguide comprises a first conductor surface facing toward the interior of the waveguide, a second conductor surface facing toward the interior of the waveguide, and a slot extending from the first conductor surface to the outside of the waveguide;
the first conductor surface and the second conductor surface electrically communicate with each other and face each other;
a first length which is the length in a y direction of the first conductor surface in a cross section perpendicular to the z direction is smaller than a second length which is the length in the y direction of the second conductor surface in the cross section perpendicular to the z direction;
the first length comprises the length in the y direction of the slot in the cross section perpendicular to the z direction; and
the second length is smaller than the distance between the first conductor surface and the second conductor surface in an x direction.

2. A plasma generation apparatus according to claim 1, wherein each of the first conductor surface and the second conductor surface is a surface parallel to a yz plane.

3. A plasma generation apparatus according to claim 1, wherein
the waveguide comprises a third conductor surface and a fourth conductor surface which face toward the interior of the waveguide, are continuous with the second conductor surface, and face each other, and at least one of a first connection surface and a second connection surface;
each of the third conductor surface and the fourth conductor surface comprises a surface parallel to an xz plane;
the first connection surface establishes connection between the slot or the first conductor surface and the third conductor surface; and
the second connection surface establishes connection between the slot or the first conductor surface and the fourth conductor surface.

4. A plasma generation apparatus according to claim 3, wherein the distance between the first connection surface and the fourth conductor surface increases with the distance from the first conductor surface.

5. A plasma generation apparatus according to claim 3, wherein the distance between the second connection surface and the third conductor surface increases with the distance from the first conductor surface.

6. A plasma generation apparatus according to claim 1, wherein
the waveguide comprises a third conductor surface and a fourth conductor surface which face toward the interior of the waveguide, are continuous with the second conductor surface, and face each other, a fifth conductor surface which faces toward the interior of the waveguide and faces a portion of the third conductor surface, and a sixth conductor surface which faces toward the interior of the waveguide and faces a portion of the fourth conductor surface;
each of the third conductor surface and the fourth conductor surface comprises a surface parallel to an xz plane;
the length of the fifth conductor surface in the x direction and the length of the sixth conductor surface in the x direction are smaller than the distance between the first conductor surface and the second conductor surface.

7. A plasma generation apparatus according to claim 1, wherein
the waveguide comprises a third conductor surface and a fourth conductor surface which face toward the interior of the waveguide, are continuous with the second conductor surface, and face each other, a fifth conductor surface which faces toward the interior of the waveguide and is continuous with the first conductor surface, and a sixth conductor surface which faces toward the interior of the waveguide and is continuous with the third conductor surface;
the sixth conductor surface is located between the third conductor surface and the fifth conductor surface; and
the waveguide satisfies the following equation:

$$0.24 \cdot A - 3.6 \leq a \leq 0.56 \cdot A - 8.4$$

where A is the distance between the first conductor surface and the second conductor surface in a cross section of the waveguide perpendicular to a transmission direction, and a is the distance between the first conductor surface and the sixth conductor surface in the cross section of the waveguide perpendicular to the transmission direction.

8. A plasma generation apparatus according to claim 7, wherein
the waveguide comprises a seventh conductor surface at a position adjacent to the fifth conductor surface in the z direction; and
the distance between the seventh conductor surface and the fourth conductor surface is larger than the distance between the fifth conductor surface and the fourth conductor surface.

9. A plasma generation apparatus according to claim 1, wherein the slot is formed such that an angle of the longitudinal direction of the slot in relation to the transmission direction of the waveguide is not 90°.

* * * * *